US011513159B1

(12) United States Patent
Fotak et al.

(10) Patent No.: US 11,513,159 B1
(45) Date of Patent: Nov. 29, 2022

(54) SYSTEMS FOR ANALYSIS OF VEHICLE ELECTRICAL SYSTEM PERFORMANCE

(71) Applicant: Geotab Inc., Oakville (CA)

(72) Inventors: Meghan Frances Fotak, Mississauga (CA); Daniel J. Lewis, Cambridge (CA); Jialin Zhu, Toronto (CA); Mark Jeffrey Davidson, Alpharetta, GA (US)

(73) Assignee: Geotab Inc., Oakville (CA)

( * ) Notice: Subject to any disclaimer, the term of this patent is extended or adjusted under 35 U.S.C. 154(b) by 0 days.

(21) Appl. No.: 17/827,854

(22) Filed: May 30, 2022

Related U.S. Application Data

(60) Provisional application No. 63/298,848, filed on Jan. 12, 2022, provisional application No. 63/208,767, filed on Jun. 9, 2021.

(51) Int. Cl.
*G01R 31/3835* (2019.01)
*G07C 5/08* (2006.01)

(52) U.S. Cl.
CPC ....... *G01R 31/3835* (2019.01); *G07C 5/0808* (2013.01)

(58) Field of Classification Search
None
See application file for complete search history.

(56) References Cited

U.S. PATENT DOCUMENTS

| | | | | |
|---|---|---|---|---|
| 2008/0119976 | A1* | 5/2008 | Tarchinski | G01R 31/007 701/31.4 |
| 2015/0161893 | A1* | 6/2015 | Duncan | G07C 5/085 701/1 |
| 2015/0361941 | A1* | 12/2015 | Du | G01M 15/048 702/33 |
| 2016/0078695 | A1* | 3/2016 | McClintic | G07C 5/0816 701/29.4 |
| 2017/0309092 | A1* | 10/2017 | Rosenbaum | G07C 5/008 |
| 2021/0118248 | A1* | 4/2021 | Martin | G07C 5/085 |

* cited by examiner

*Primary Examiner* — Jas A Sanghera
(74) *Attorney, Agent, or Firm* — Mark J. Pringle-Rigby

(57) ABSTRACT

The present disclosure relates to systems and methods for analyzing health of vehicle batteries and vehicle electrical systems. Vehicle batteries, as well as other components of a vehicle electrical system, tend to degrade over time, and eventually fail. The described systems and methods generate an electrical system metric based on electrical data from a plurality of vehicles. Electrical system performance of individual vehicles is compared to the generated electrical system metric, to determine electrical system performance of vehicles relative to other similar vehicles.

19 Claims, 8 Drawing Sheets

SYSTEMS FOR ANALYSIS OF VEHICLE ELECTRICAL SYSTEM PERFORMANCE

PRIOR APPLICATION DATA

This application claims priority to U.S. Provisional Patent Application No. 63/208,767 titled "Automating Control Limits for Electrical System Rating", filed on Jun. 9, 2021; and to U.S. Provisional Patent Application No. 63/298,848 titled "Systems and Methods for Analysis of Vehicle Electrical System Performance", filed on Jan. 12, 2022.

TECHNICAL FIELD

The present disclosure generally relates to systems and methods for analyzing health of vehicle batteries and vehicle electrical systems, and in particular relates to analyzing battery health or electrical system health with reference to an electrical systems metric.

BACKGROUND

Vehicles typically have a vehicle battery which provides electrical power to the vehicle. Such a vehicle battery provides power to start the vehicle (ignition, for vehicles with an internal combustion engine), and can provide power for electrical vehicle accessories (lights, infotainment, etcetera). Such batteries tend to degrade with time and use, and become less able to store charge or output less power when compared to a new battery. Eventually, a vehicle battery can become too weak to start a vehicle engine, resulting in the vehicle being unusable. Additionally, other elements of a vehicle electrical system can degrade and fail over time. An example of such is a vehicle alternator, which charges a vehicle battery during vehicle operation. Failure of such electrical components can also result in a vehicle becoming unusable. Incidences of a vehicle being unusable can be inconvenient or costly. It is desirable to be able to determine or estimate health of a vehicle battery to predict or mitigate this.

SUMMARY

According to a broad aspect, the present disclosure describes a system comprising: at least one processor; and at least one non-transitory processor-readable storage medium communicatively coupled to the at least one processor, the at least one non-transitory processor-readable storage medium storing processor-executable instructions which when executed by the at least one processor, cause the at least one processor to: determine, for a first subset of vehicles, a first electrical characterization; determine, for a second subset of vehicles different from the first subset of vehicles, a second electrical characterization; determine a difference between the first electrical characterization and the second electrical characterization; select a select subset of vehicles, wherein: the select subset of vehicles includes the first subset of vehicles; the select subset of vehicles includes the second subset of vehicles if the difference between the first electrical characterization and the second electrical characterization is within a characterization threshold; and the select subset of vehicles does not include the second subset of vehicles if the difference between the first electrical characterization and the second electrical characterization is not within the characterization threshold; and generate, based on electrical data representing vehicles of the select subset of vehicles, an electrical system metric which is indicative of electrical system performance of vehicles which correspond to vehicles in the select subset of vehicles.

The processor-executable instructions which cause the at least one processor to determine, for the first subset of vehicles, the first electrical characterization, may cause the at least one processor to: identify at least one first electrical parameter for each vehicle of the first subset of vehicles, based on electrical data collected for each vehicle of the first subset of vehicles; determine, for each vehicle of the first subset of vehicles, a respective first statistical measure of the respective at least one identified first electrical parameter; and determine the first electrical characterization of the first subset of vehicles by synthesizing each of the respective first statistical measures; and the processor-executable instructions which cause the at least one processor to determine, for the second subset of vehicles, the second electrical characterization, may cause the at least one processor to: identify at least one second electrical parameter for each vehicle of the second subset of vehicles, based on electrical data collected for each vehicle of the second subset of vehicles; determine, for each vehicle of the second subset of vehicles, a respective second statistical measure of the respective at least one identified second electrical parameter; and determine the second electrical characterization of the second subset of vehicles by synthesizing each of the respective second statistical measures.

The processor-executable instructions which cause the at least one processor to determine the first electrical characterization of the first subset of vehicles by synthesizing each of the respective first statistical measures may cause the at least one processor to: determine at least one of a first mean, a first median, or a first standard deviation for all of the first statistical measures; and the processor-executable instructions which cause the at least one processor to determine the second electrical characterization of the second subset of vehicles by synthesizing each of the respective second statistical measures may cause the at least one processor to: determine at least one of a second mean, a second median, or a second standard deviation for all of the second statistical measures.

The processor-executable instructions which cause the at least one processor to determine at least one of the first mean, the first median, or the first standard deviation for all of the first statistical measures may cause the at least one processor to determine each of the first mean, the first median, and the first standard deviation for all of the first statistical measures; and the processor-executable instructions which cause the at least one processor to determine at least one of the second mean, the second median, or the second standard deviation for all of the second statistical measures may cause the at least one processor to determine each of the second mean, the second median, and the second standard deviation for all of the second statistical measures.

The processor-executable instructions which cause the at least one processor to determine the difference between the first electrical characterization and the second electrical characterization may cause the at least one processor to determine a first difference between the first mean and the second mean, a second difference between the first median and the second median, and a third difference between the first standard deviation and the second standard deviation; the characterization threshold may include a mean threshold, a median threshold, and a standard deviation threshold; the difference between the first electrical characterization and the second electrical characterization may not be within the characterization threshold if the first difference is not within the mean threshold, the second difference is not within the median threshold, or the third difference is not within the standard deviation threshold; and the difference between the first electrical characterization and the second electrical characterization may be within the characterization threshold if the first difference is within the mean threshold, the second difference is within the median threshold, and the third difference is within the standard deviation threshold.

The processor-executable instructions which cause the at least one processor to determine the difference between the first electrical characterization and the second electrical characterization may cause the at least one processor to: determine a first difference between the first mean and the second mean, a second difference between the first median and the second median, and a third difference between the first standard deviation and the second standard deviation; and determine a vector distance where the first difference, the second difference, and the third difference are vector components of the vector distance; the difference between the first electrical characterization and the second electrical characterization may not be within the characterization threshold if the vector distance is not within a vector distance threshold; and the difference between the first electrical characterization and the second electrical characterization may be within the characterization threshold if the vector distance is within the vector distance threshold.

Each first electrical parameter corresponding to a respective vehicle of the first subset of vehicles may comprise a respective cranking voltage during an ignition event of the respective vehicle of the first subset of vehicles; and each second electrical parameter corresponding to a respective vehicle of the second subset of vehicles may comprise a respective cranking voltage during an ignition event of the respective vehicle of the second subset of vehicles. Each respective cranking voltage during an ignition event may comprise a minimum vehicle battery voltage reached during the ignition event.

The processor executable instructions may further cause the at least one processor to determine, for a third subset of vehicles, a third electrical characterization; the processor executable instructions may further cause the at least one processor to determine a difference between the first electrical characterization and the third electrical characterization; the select subset of vehicles may include the third subset of vehicles if the difference between the first electrical characterization and the third electrical characterization is within the characterization threshold; and the select subset of vehicles may not include the third subset of vehicles if the difference between the first electrical characterization and the third electrical characterization is not within the characterization threshold.

The processor executable instructions may further cause the at least one processor to determine, for a plurality of additional subsets of vehicles, a respective additional electrical characterization for each additional subset of vehicles; the processor executable instructions may further cause the at least one processor to determine a plurality of respective differences between the first electrical characterization and each respective additional electrical characterization; the select subset of vehicles may include each additional subset of vehicles for which the respective difference between the first electrical characterization and the respective additional electrical characterization is within the characterization threshold; and the select subset of vehicles may not include each additional subset of vehicles for which the respective difference between the first electrical characterization and the respective additional electrical characterization is not within the characterization threshold.

The processor-executable instructions which cause the at least one processor to determine a difference between the first electrical characterization and the second electrical characterization may cause the at least one processor to determine a distance between the first electrical characterization and the second electrical characterization using a distance function or a similarity metric.

The processor-executable instructions which cause the at least one processor to determine a difference between the first electrical characterization and the second electrical characterization may cause the at least one processor to determine a Wasserstein distance between the first electrical characterization and the second electrical characterization. The processor-executable instructions which cause the at least one processor to determine a difference between the first electrical characterization and the second electrical characterization may cause the at least one processor to determine the difference between the first electrical characterization and the second electrical characterization using a similarity metric selected from a group of similarity metrics consisting of: Kolmogrov-Smirnov test; and chi-squared test.

The characterization threshold may further comprise a vehicle ratio threshold; and the second subset of vehicles may not be within the characterization threshold if a proportion of vehicles in the second subset of vehicles which are owned by a single entity exceeds the vehicle ratio threshold.

The characterization threshold may further comprise a cranking event ratio threshold; and the second subset of vehicles may not be within the characterization threshold if a proportion of cranking events in data from the second subset of vehicles, for vehicles which are owned by a single entity, exceeds the cranking event ratio threshold.

The characterization threshold may further comprise a unique entity threshold; and the second subset of vehicles may not be within the characterization threshold if a total number of unique entities which own vehicles in the second subset of vehicles is below the unique entity threshold.

The characterization threshold may further comprise a sample size threshold; and the second subset of vehicles may not be within the characterization threshold if a total number of vehicles in the second subset of vehicles is below the sample size threshold.

According to another broad aspect, the present disclosure describes a method comprising: determining, by at least one processor for a first subset of vehicles, a first electrical characterization; determining, by the at least one processor for a second subset of vehicles different from the first subset of vehicles, a second electrical characterization; determining, by the at least one processor, a difference between the first electrical characterization and the second electrical characterization; selecting, by the at least one processor, a select subset of vehicles, wherein: the select subset of vehicles includes the first subset of vehicles; the select subset of vehicles includes the second subset of vehicles if the difference between the first electrical characterization and the second electrical characterization is within a characterization threshold; and the select subset of vehicles does not include the second subset of vehicles if the difference between the first electrical characterization and the second electrical characterization is not within the characterization threshold; and generating, by the at least one processor based on electrical data representing vehicles of the select subset of vehicles, an electrical system metric which is indicative of electrical system performance of vehicles which correspond to vehicles in the select subset of vehicles.

Determining, by the at least one processor for the first subset of vehicles, the first electrical characterization, may comprise: identifying at least one first electrical parameter for each vehicle of the first subset of vehicles, based on electrical data collected for each vehicle of the first subset of vehicles; determining, for each vehicle of the first subset of vehicles, a respective first statistical measure of the respective at least one identified first electrical parameter; and determining the first electrical characterization of the first subset of vehicles by synthesizing each of the respective first statistical measures; and determining, by the at least one processor for the second subset of vehicles, the second electrical characterization may comprise: identifying at least one second electrical parameter for each vehicle of the second subset of vehicles, based on electrical data collected for each vehicle of the second subset of vehicles; determining, for each vehicle of the second subset of vehicles, a respective second statistical measure of the respective at least one identified second electrical parameter; and determining the second electrical characterization of the second subset of vehicles by synthesizing each of the respective second statistical measures.

Determining the first electrical characterization of the first subset of vehicles by synthesizing each of the respective first statistical measures may comprise: determining at least one of a first mean, a first median, or a first standard deviation for all of the first statistical measures; and determining the second electrical characterization of the second subset of vehicles by synthesizing each of the respective second statistical measures may comprise: determining at least one of a second mean, a second median, or a second standard deviation for all of the second statistical measures.

Determining at least one of a first mean, a first median, or a first standard deviation for all of the first statistical measures may comprise determining each of the first mean, the first median, and the first standard deviation for all of the first statistical measures; and determining at least one of a second mean, a second median, or a second standard deviation for all of the second statistical measures may comprise determining each of the second mean, the second median, and the second standard deviation for all of the second statistical measures.

Determining a difference between the first electrical characterization and the second electrical characterization may comprise determining a first difference between the first mean and the second mean, a second difference between the first median and the second median, and a third difference between the first standard deviation and the second standard deviation; the characterization threshold may include a mean threshold, a median threshold, and a standard deviation threshold; the difference between the first electrical characterization and the second electrical characterization may not be within the characterization threshold if the first difference is not within the mean threshold, the second difference is not within the median threshold, or the third difference is not within the standard deviation threshold; and the difference between the first electrical characterization and the second electrical characterization may be within the characterization threshold if the first difference is within the mean threshold, the second difference is within the median threshold, and the third difference is within the standard deviation threshold.

Determining a difference between the first electrical characterization and the second electrical characterization may comprise: determining a first difference between the first mean and the second mean, a second difference between the first median and the second median, and a third difference between the first standard deviation and the second standard deviation; and determining a vector distance where the first difference, the second difference, and the third difference are vector components of the vector distance; the difference between the first electrical characterization and the second electrical characterization may not be within the characterization threshold if the vector distance is not within a vector distance threshold; and the difference between the first electrical characterization and the second electrical characterization may be within the characterization threshold if the vector distance is within the vector distance threshold.

Each first electrical parameter corresponding to a respective vehicle of the first subset of vehicles may comprise a respective cranking voltage during an ignition event of the respective vehicle of the first subset of vehicles; and each second electrical parameter corresponding to a respective vehicle of the second subset of vehicles may comprise a respective cranking voltage during an ignition event of the respective vehicle of the second subset of vehicles. Each respective cranking voltage during an ignition event may comprise a minimum vehicle battery voltage reached during the ignition event.

The method may further comprise determining, by the at least one processor for a third subset of vehicles, a third electrical characterization; the method may further comprise determining, by the at least one processor, a difference between the first electrical characterization and the third electrical characterization; the select subset of vehicles may include the third subset of vehicles if the difference between the first electrical characterization and the third electrical characterization is within the characterization threshold; and the select subset of vehicles may not include the third subset of vehicles if the difference between the first electrical characterization and the third electrical characterization is not within the characterization threshold.

The method may further comprise determining, by the at least one processor for a plurality of additional subsets of vehicles, a respective additional electrical characterization for each additional subset of vehicles; the method may further comprise, by the at least one processor, determining a plurality of respective differences between the first electrical characterization and each respective additional electrical characterization; the select subset of vehicles may include each additional subset of vehicles for which the respective difference between the first electrical characterization and the respective additional electrical characterization is within the characterization threshold; and the select subset of vehicles may not include each additional subset of vehicles for which the respective difference between the first electrical characterization and the respective additional electrical characterization is not within the characterization threshold.

Determining a difference between the first electrical characterization and the second electrical characterization may comprise determining a distance between the first electrical characterization and the second electrical characterization using a distance function or a similarity metric.

Determining a difference between the first electrical characterization and the second electrical characterization may comprise determining a Wasserstein distance between the first electrical characterization and the second electrical characterization. Determining a difference between the first electrical characterization and the second electrical characterization may comprise determining the difference between the first electrical characterization and the second electrical characterization using a similarity metric selected from a group of similarity metrics consisting of: Kolmogrov-Smirnov test; and chi-squared test.

The characterization threshold may further comprise a vehicle ratio threshold; and the second subset of vehicles may not be within the characterization threshold if a proportion of vehicles in the second subset of vehicles which are owned by a single entity exceeds the vehicle ratio threshold.

The characterization threshold may further comprise a cranking event ratio threshold; and the second subset of vehicles may not be within the characterization threshold if a proportion of cranking events in data from the second subset of vehicles, for vehicles which are owned by a single entity, exceeds the cranking event ratio threshold.

The characterization threshold may further comprise a unique entity threshold; and the second subset of vehicles may not be within the characterization threshold if a total number of unique entities which own vehicles in the second subset of vehicles is below the unique entity threshold.

The characterization threshold may further comprise a sample size threshold; and the second subset of vehicles may not be within the characterization threshold if a total number of vehicles in the second subset of vehicles is below the sample size threshold.

According to another broad aspect, the resent disclosure describes a method of assessing electrical performance of a first vehicle, the method comprising: comparing data representing an electrical parameter measured from the first vehicle to an electrical system metric, the electrical system metric based on data representing respective electrical parameters from a plurality of vehicles; and determining a value indicative of electrical performance of the first vehicle based on the electrical parameter measured from the first vehicle relative to the electrical system metric, wherein the plurality of vehicles includes: a subset of vehicles of identical model as the first vehicle; and a subset of vehicles not of identical model as the first vehicle.

The method may further comprise obtaining the data representing the electrical parameter by measuring the electrical parameter from the first vehicle.

The method may further comprise receiving the data representing the electrical parameter.

The electrical parameter may comprise a cranking voltage during a cranking event of the first vehicle. The cranking voltage during the cranking event may comprise a minimum vehicle battery voltage reached during the cranking event. The cranking voltage during the cranking event may comprise a mean vehicle battery voltage over the cranking event. The cranking voltage during the cranking event may comprise a vehicle battery voltage swing over the cranking event.

BRIEF DESCRIPTION OF THE DRAWINGS

Exemplary non-limiting embodiments are described with reference to the accompanying drawings in which.

DETAILED DESCRIPTION

The present disclosure details systems and methods for analyzing electrical system performance of vehicles, with reference to an electrical system metric.

Figure 1:
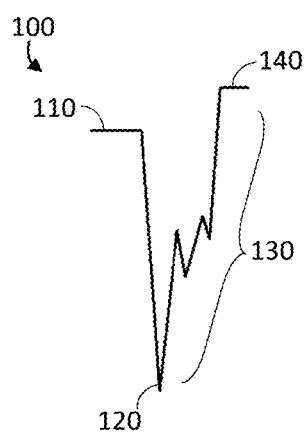
FIG. 1 is a graphical representation of an exemplary voltage curve for a vehicle battery during a cranking event.

FIG. 1 is a graphical representation of an exemplary voltage curve 100 for a vehicle battery during a cranking event (an event where the vehicle battery outputs energy to start an internal combustion engine). Various points of interest pertaining to the cranking event are labelled by reference numerals. At 110, prior to the cranking event, the voltage of the battery is at resting voltage (voltage when the battery is not under load, or at least the battery is not being loaded with cranking the engine even if other loads such as vehicle accessory power are present). For many vehicles, the resting voltage is approximately 12 Volts, e.g. 12.6V, but the resting voltage can be any voltage as appropriate for a given vehicle. At 120, the battery voltage is at a minimum voltage during the cranking event (i.e. the battery is under the greatest load to crank the engine). At 130, the battery voltage is in recovery (i.e. the engine cranking load is relieved, and the battery voltage is recovering from the minimum voltage). At 140, the battery is being charged by the alternator, and hence voltage is slightly higher than the resting voltage.

Figure 2:
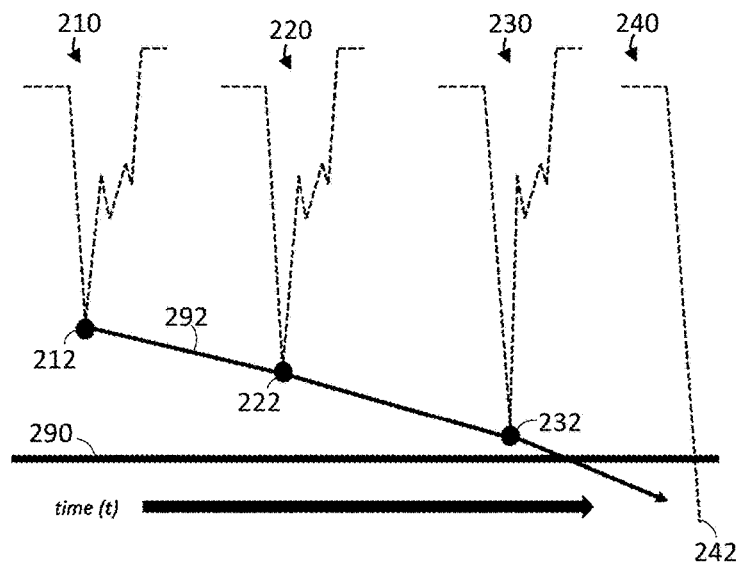
FIG. 2 is a graphical representation of respective voltage curves for a plurality of cranking events of a given vehicle battery over time.

FIG. 2 is a graphical representation of respective voltage curves for a plurality of cranking events of a given vehicle battery over time. FIG. 2 shows voltage curves for four cranking events 210, 220, 230, and 240, though fewer or more cranking events could be represented as appropriate. Battery voltage for each cranking event is similar to as described with reference to voltage curve 100 in FIG. 1; description of voltage curve 100 in FIG. 1 is applicable to the voltage curves for cranking events 210, 220, 230, and 240 in FIG. 2. In FIG. 2, minimum voltage during cranking event 210 is labelled as 212; minimum voltage during cranking event 220 is labelled as 222; minimum voltage during cranking event 230 is labelled as 232; and minimum voltage during cranking event 240 is labelled as 242. Minimum voltages 212, 222, 232, and 242 get progressively lower; that is, performance of the vehicle battery decreases over time and with use (though other electrical system of the vehicles could be responsible for apparent battery decline, as discussed later). A failure threshold 290 is also illustrated in FIG. 2, which is representative of a voltage at which the vehicle engine will fail to start. Minimum voltages 212, 222, and 232 are above failure threshold 290, and thus the vehicle engine successfully starts for cranking events 210, 220, and 230. However, minimum voltage 242 is below failure threshold 290, and the vehicle engine fails to start for cranking event 240. Performance of the vehicle battery is modelled in FIG. 2 by curve 292, which represents each of the minimum voltages.

FIG. 2 illustrates the failure threshold being based on minimum voltage during a cranking event. However, other characteristics of cranking events can be evaluated for determining battery performance. For example, as battery performance decreases, a difference between resting voltage (110 in FIG. 1) and minimum voltage (120 in FIG. 1) increases. That is, total voltage swing during a cranking event is indicative of performance of a battery, with high voltage swing indicating that a battery has lower performance than a battery with a smaller voltage swing. As another example, voltage over a cranking event can be averaged, and average voltage during the cranking event can be used as an indicator of electrical system performance. As yet another example, duration of the cranking event is indicative of electrical system performance: a longer cranking event is indicative of poorer electrical system performance compared to a shorter cranking event.

The above examples discuss battery degradation and battery failure, but degradation and failure of other electrical system components can also be responsible for ignition failure in a vehicle. For example, if a vehicle alternator degrades or fails, the vehicle battery may not be properly or fully charged. If the vehicle battery is not fully charge, voltage during a cranking event will also be lower than if the battery were fully charge. As such, cranking voltage is also indicative of performance of other electrical system components, not only battery health.

It is desirable to inspect, service, and/or replace components of a vehicle electrical system before electrical performance falls below the failure threshold, to avoid failure of the vehicle. In some cases, electrical system components are proactively replaced on a predetermined schedule; for example after a battery reaches a certain age, or after a battery has been used in a vehicle for a certain driving distance, said battery could be scheduled for replacement. However, such predetermined schedules are prone to inaccuracy. For example, not all components (including batteries) have equal performance, even from the same manufacturer or production facility. As another example, different components (including batteries) will be subjected to different conditions which will affect the performance of the battery, such as temperature, humidity, frequency of use, etcetera. Consequently, if a replacement schedule is designed such that components are replaced very close to an expected failure time (e.g. a mean failure time or a median failure time), a significant quantity of components will fail before their scheduled replacement date. Conversely, if a replacement schedule is designed such that components are replaced well before their expected failure time, many components will be replaced too early. This wastes resources, time, and money on replacing many components which still achieve usable or reliable performance.

In view of the above, it is desirable to be able to monitor electrical system performance for a vehicle, and predict when the electrical system for the vehicle should be inspected or service (e.g. immediately prior to battery failure). This allows individual components to be serviced or replaced as close as possible to an expected failure time, thus reducing risk of vehicle failure and reducing waste due to premature replacement.

Figure 3:
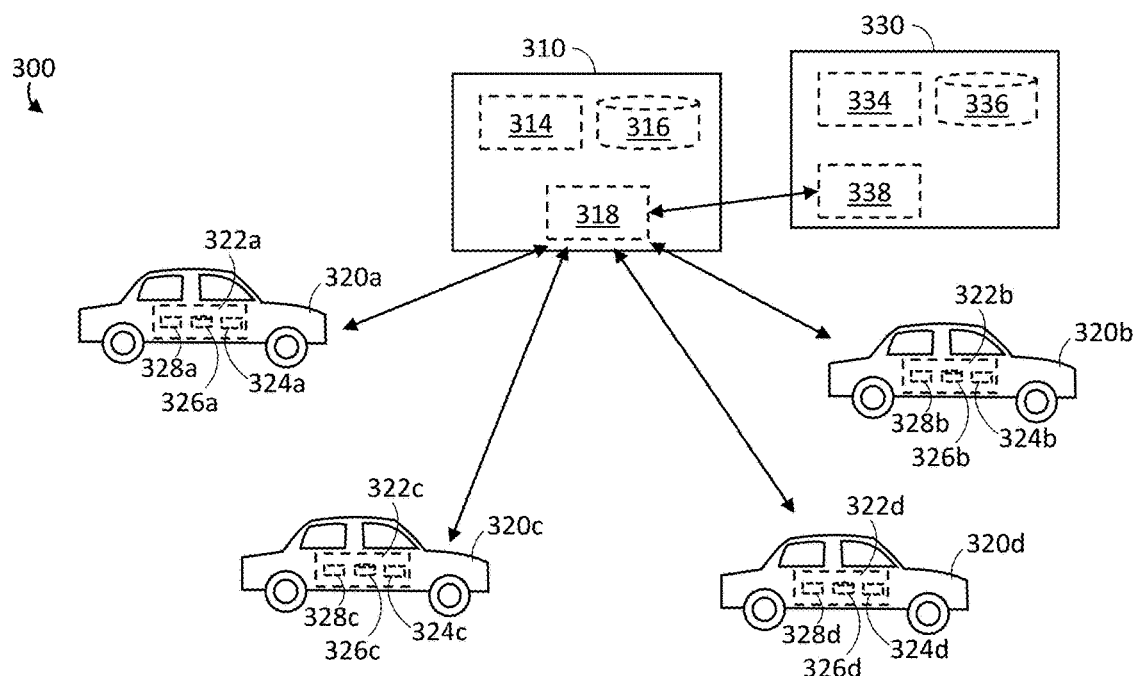
FIG. 3 is a schematic view of a system for managing data for a plurality of vehicles.

FIG. 3 is a schematic view of a system 300 for managing data for a plurality of vehicles. FIG. 3 shows a management device 310, which includes at least one processor 314, at least one non-transitory processor-readable storage medium 316, and a communication interface 318. Although illustrated as one device, management device 310 can include a plurality of devices, a plurality of processors 314, a plurality of non-transitory processor-readable storage mediums 316, and/or a plurality of communication interfaces 318. Further, such a plurality of management devices can be in close proximity (e.g. in a central server location), or can be distributed across different locations (e.g. as remote devices). Communication interface 318 can be a wired or wireless interface, through which management device 310 communicates with other devices, such as a plurality of vehicles, vehicle devices, or user devices.

In the illustrated example, management device 310 is shown as communicating with vehicle devices in four vehicles 320a, 320b, 320c, and 320d (collectively referred to as vehicles 320). However, management device 310 could communicate with vehicle devices in any appropriate number of vehicles, such as one vehicle, dozens of vehicles, hundreds of vehicles, thousands of vehicles, or even more vehicles.

Vehicle 320a includes at least one processor 324a, at least one non-transitory processor-readable storage medium 326a, and a communication interface 328a. Together, the at least one processor 324a, the at least one non-transitory processor-readable storage medium 326a, and the communication interface 328a can be referred to as "vehicle device" 322a.

Vehicle 320b includes at least one processor 324b, at least one non-transitory processor-readable storage medium 326b, and a communication interface 328b. Together, the at least one processor 324b, the at least one non-transitory processor-readable storage medium 326b, and the communication interface 328b can be referred to as "vehicle device" 322b.

Vehicle 320c includes at least one processor 324c, at least one non-transitory processor-readable storage medium 326c, and a communication interface 328c. Together, the at least one processor 324c, the at least one non-transitory processor-readable storage medium 326c, and the communication interface 328c can be referred to as "vehicle device" 322c.

Vehicle 320d includes at least one processor 324d, at least one non-transitory processor-readable storage medium 326d, and a communication interface 328d. Together, the at least one processor 324d, the at least one non-transitory processor-readable storage medium 326d, and the communication interface 328d can be referred to as "vehicle device" 322d.

Collectively, vehicle 320a, vehicle 320b, vehicle 320c, and vehicle 320d can be referred to as "vehicles 320". Collectively, the at least one processor 324a, the at least one processor 324b, the at least one processor 324c, and the at least one processor 324d can be referred to as "processors 324". Collectively, the at least one non-transitory processor-readable storage medium 326a, the at least one non-transitory processor-readable storage medium 326b, the at least one non-transitory processor-readable storage medium 326c, and the at least one non-transitory processor-readable storage medium 326d can be referred to as "non-transitory processor-readable storage mediums 326". Collectively, communication interface 328a, communication interface 328b, communication interface 328c, and communication interface 328d can be referred to as "communication interfaces 328". Collectively, vehicle device 322a, vehicle device 322b, vehicle device 322c, and vehicle device 322d can be referred to as "vehicle devices 322".

Any of the communication interfaces 328 can be a wired interface or a wireless interface, or a vehicle device can include both a wired communication interface and a wireless communication interface.

Each of vehicle devices 322 can be a monolithically packaged device (i.e. a device contained in a single housing) which is installed in a respective vehicle. For example, any of vehicle devices 322 could be a telematics device, which plugs into the respective vehicle (e.g. at the OBDII port). Such telematics devices can gather vehicle information from the vehicle, from sensors built into the telematics device itself, and communicate said information to management devices such as management device 310. However, this is not necessarily the case, and each vehicle device 322 can refer to the collection of components installed in a vehicle (i.e. they do not have to be packaged in a single housing). As an example, a vehicle manufacturer could install processing, storage, and communication equipment in vehicles for the purpose of collecting, processing, and transmitting data. Further, components of any of the vehicle devices 322 can be multi-purpose components which serve other functions within the vehicle.

FIG. 3 also shows an optional device 330, which includes at least one processor 334, at least one non-transitory processor-readable storage medium 336, and a communication interface 338. Although illustrated as one device, device 330 can include a plurality of devices, a plurality of processors 334, a plurality of non-transitory processor-readable storage mediums 336, and/or a plurality of communication interfaces 338. Further, such a plurality of management devices can be in close proximity (e.g. in a central server location), or can be distributed across different locations (e.g. as remote devices). Communication interface 338 can be a wired or wireless interface, through which device 330 communicates with other devices.

In the illustrated example, device 330 communicates with management device 310 via communication interfaces 318 and 338. Such communication can be direct or indirect (e.g. over the internet or any other network). Device 330 can perform processing and provide data to management device 310, which management device 310 in turn uses to manage at least one fleet of vehicles (e.g. vehicles 320). As an example, management device 310 may be owned by one entity, which manages a fleet of vehicles. Device 330 may belong to another entity, which provides services to many fleets of vehicles. As a result, device 330 may have access to more vehicle data (i.e. data from a larger quantity of vehicles) compared to management device 310. In an exemplary use case, device 330 may generate an electric system metric as discussed in detail later for at least one plurality of vehicles, based on a large amount of vehicle data available to device 330. Device 330 communicates this electrical system metric to management device 310, which management device 310 then uses to assess electrical system performance of similar vehicles in a fleet managed by management device 310 (e.g. vehicles 320). In this way, management device 310 can assess electrical system performance of vehicles based on a large amount of statistical data that management device 310 itself does not have access to.

Figure 4:
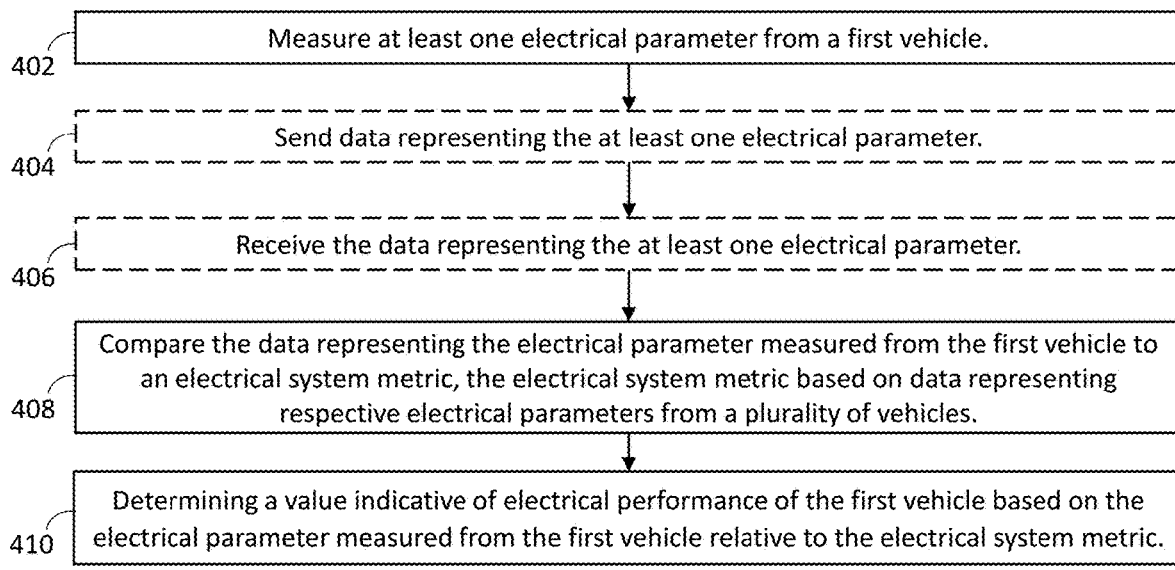
FIG. 4 is a flowchart diagram which illustrates an exemplary method for determining electrical system performance of a vehicle.

FIG. 4 is a flowchart diagram which illustrates an exemplary method 400. Method 400 as illustrated includes acts 402, 404, 406, 408, and 410. One skilled in the art will appreciate that additional acts could be added, acts could be removed, or acts could be reordered as appropriate for a given application. With reference to the example illustrated in FIG. 3, acts can be performed by appropriate components of management device 310 or vehicle devices 322. Further, any of the at least one non-transitory processor-readable storage mediums 316 or 326 could have instructions stored thereon, which when executed by a respective at least one processor (processors 314 or 324) cause the respective management device 310 or vehicle device 322 to perform a given act of method 400. In the discussion of method 400 below, reference to an act being performed by at least one processor 324 refers to the act being performed by any of processors 324a, 324b, 324c, or 324d. Reference to an act being performed by at least one non-transitory processor-readable storage medium 326 refers to the act being performed by any of non-transitory processor-readable storage mediums 326a, 326b, 326c, or 326d. Reference to an act being performed by communication interface 328 refers to the act being performed by any of communication interfaces 328a, 328b, 328c, or 328d. Typically, for a combination of acts performed by a combination of at least one processor, at least one non-transitory processor-readable storage medium, and a communication interface of a vehicle device, the combination of acts are performed by at least one processor, at least one non-transitory processor-readable storage medium, and a communication interface common to one of vehicle devices 322a, 322b, 322c, or 322d (or any other similar vehicle device).

At 402, at least one electrical parameter is measured from a first vehicle (e.g. any of vehicles 320). The at least one electrical parameter could include a cranking voltage during a cranking event (ignition event) of the first vehicle. For example, the cranking voltage during the cranking event could comprise minimum cranking voltage during the cranking event, mean voltage over the cranking event, voltage swing over the cranking event, or any other appropriate electrical parameter. Measuring of the electrical parameter can be performed by any appropriate electrical sensor or sensing circuit, such as a voltage sensor, current sensor, resistance sensor. The measured at least one electrical parameter can be collected by any appropriate vehicle device 322 (such as a telematics monitoring device).

At 404, data representing the at least one electrical parameter is sent from the first vehicle (via a respective communication interface 328), and at 406 the data representing the at least one electrical parameter is received by a device remote from the first vehicle (e.g. management device 310, by communication interface 318). Acts 404 and 406 are optional, and can be performed when analysis of the electrical parameter is performed remotely from the first vehicle. In some implementations, analysis of the electrical parameter can be performed within the hardware of the first vehicle (e.g. by a respective at least one processor 324), such that acts 404 and 406 do not need to be performed. Acts 404 and 406 are shown in dashed lines in FIG. 4 to indicate this optionality.

At 408, the data presenting the electrical parameter measured from the first vehicle is compared to an electrical system metric, such as the Electrical System Rating (ESR) metric illustrated in FIG. 5 discussed later. The electric system metric is based on data representing respective electrical parameters from a plurality of vehicles, as discussed later with reference to FIGS. 13 and 14. The plurality of vehicles can include a subset of vehicles highly similar to the first vehicle (e.g. of the same make, fuel type, model, and engine as the first vehicle), and vehicles which are partially different from the first vehicle (e.g. at least some of make, fuel type, model, and engine may be different from the first vehicle). This is discussed in more detail later with reference to FIGS. 7, 8, 9A, 9B, 9C, 9D, 10A, 10B, 10C, 10D, 11, and 12.

At 410, a value indicative of electrical performance of the first vehicle is determined based on the electrical parameter measured from the first vehicle relative to the electrical system metric. This is discussed in more detail below with reference to at least FIGS. 13 and 14. Acts 408 and 410 can be performed by any appropriate processing resource. For example, the at least one processor 314 can perform acts 408 and 410, or any of processors 324 can perform acts 408 and 410.

Figure 5:
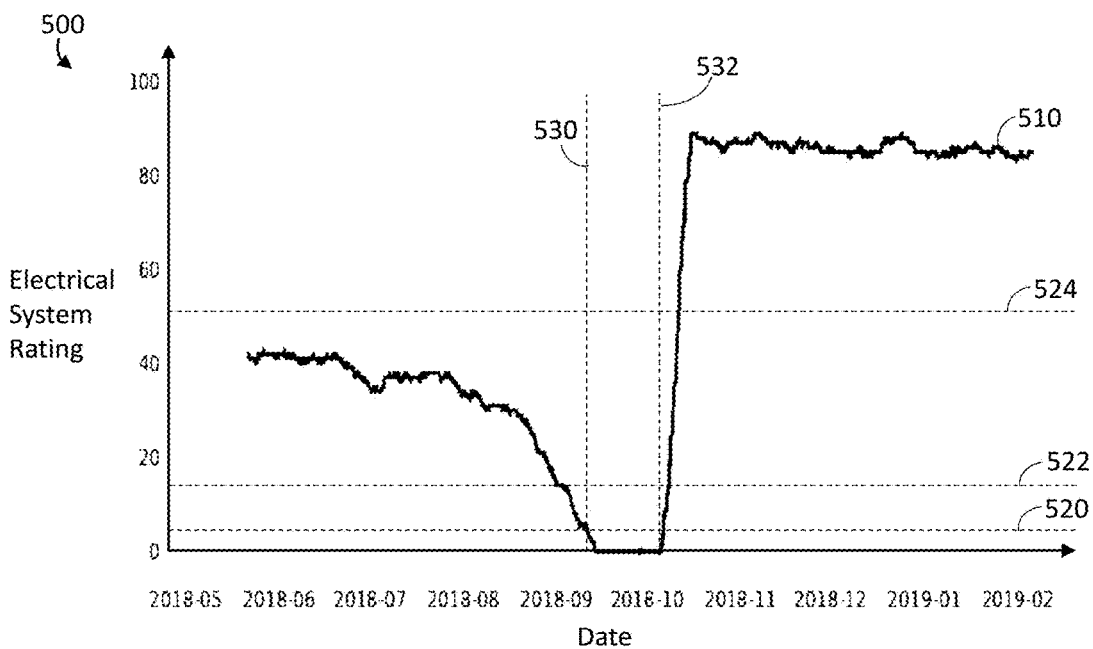
FIG. 5 illustrates a plot which shows a performance curve for an exemplary vehicle battery.

FIG. 5 illustrates a plot 500 which shows a performance curve for an electrical system of an exemplary vehicle. The vertical axis is "Electrical System Rating" (ESR), which is a measure of performance of the electrical system and the battery of the vehicle. Means for generating the Electrical System Rating (ESR) metric are discussed later with reference to FIGS. 13 and 14. In the example, Electrical System Rating represents performance of the electrical system of the vehicle on a scale of 0 to 100 (though any appropriate scale could be used).

The horizontal axis represents date (and/or time). To monitor performance of the vehicle electrical system, measurement of at least one electrical parameter is collected on a regular basis (in accordance with act 402 of method 400, and optionally acts 404 and 406). Based on the at least one electrical parameter, an ESR value is generated (as in acts 408 and 410 in method 400). The at least one electrical parameter is collected regularly (e.g. daily, every time the vehicle is started, or any other appropriate interval), and processed to generate a regular ESR value (that is, method 400 is performed regularly). Scheduling for inspection, servicing, or replacement of components of the electrical system can be performed based on the regularly determined ESR values.

FIG. 5 illustrates curve 510 which shows a plurality of regular ESR values determined based on electrical parameters collected over a time period (in the example, May 2018 to February 2019). FIG. 5 also illustrates a plurality of thresholds 520, 522, and 524, which can be used to delineate levels of performance of the vehicle battery. For example, a battery with an ESR equal to or over 50 (threshold 524) can be considered to be in "Good" condition. A battery with an ESR equal to or over 15 (threshold 522) but lower than 50 (threshold 524) can be considered to be in "Fair" condition. A battery with an ESR equal to or over 5 (threshold 520) but lower than 15 (threshold 522) can be considered to be in "Cautionary" condition. A battery with an ESR less than 5 (threshold 520) can be considered to be in "Poor" condition. ESR value can be used to determine when to inspect, service, or replace electrical system components. For example, a vehicle manager or entity may decide that an electrical system should be inspected when the condition of the electrical system is "Poor" (ESR value less than 5 in the example). A different vehicle manager with less risk tolerance may decide that an electrical system should be inspected when the condition of the electrical system is "Cautionary" (ESR value less than 15 in the example). Vehicle managers are not necessarily restricted by the exemplary nominal divisions discussed herein ("Good", "Fair", "Cautionary", and "Poor"), and may choose when to inspect, service, or replace electrical system components based on the ESR value even if said value differs from the nominal divisions. Further, in addition to scheduling electrical system inspections based on ESR value, the ESR value can be helpful to make plans (e.g. budgetary plans), even if it too early to set a precise appointment to inspect or service an electrical system. For example, a vehicle manager may determine that when electrical performance of a vehicle is "Fair", it is appropriate to budget for battery (or other component) inspection and replacement in the near future. The vehicle manager may determine that when electrical performance of a vehicle is "Cautionary", it is appropriate to budget for battery (or other component) servicing and replacement at a next service date for the vehicle. The vehicle manager may immediately book a prompt service appointment for inspecting and replacing the battery (or other electrical components) when the electrical system performance of a vehicle becomes "Poor".

Although several actions made by vehicle managers are discussed above, these actions can be automated. For example, budgeting and booking of appointments may be performed automatically by a fleet management system (or a processor thereof, such as the at least one processor 314 of management device 310) in response to identifying ESR values which match certain criteria (e.g. are within certain thresholds).

Although four different nominal levels of performance are discussed, any appropriate division of levels could be implemented as appropriate for a given application. That is, any appropriate quantity of divisions could be implemented, and divisions can be delineated at any appropriate ESR levels. Further, nominal divisions could have any appropriate name or label. In an exemplary implementation, only one threshold may be implemented, such that only two nominal conditions are available. For example, a electrical system with an ESR value equal to or above 20 may be considered to be in "Good" condition, where as an electrical system with an ESR below 20 may be considered to be in "Poor" condition. In another exemplary implementation, nominal delineations may not be implemented at all, and electrical system performance may be judged solely based on the ESR value itself.

The example of FIG. 5 illustrates how a vehicle failure could have been prevented by utilizing the systems and methods discussed herein. In particular, date 532 in FIG. 3 indicates a scheduled service date for the illustrated vehicle electrical system (based on predetermined scheduling as discussed earlier). However, the electrical system illustrated in FIG. 5 showed signs of imminent failure in advance of the scheduled date, and the ESR value for battery performance was at 0 well before the scheduled date indicated by 532. The electrical system of the vehicle of FIG. 5 is expected to have failed in advance of the scheduled service date. Had the electrical system servicing been scheduled at or around the date indicated by 530 (when the ESR value for the electrical system crossed threshold 520 into "Poor" condition), failure of the vehicle could have been prevented.

Figure 6:
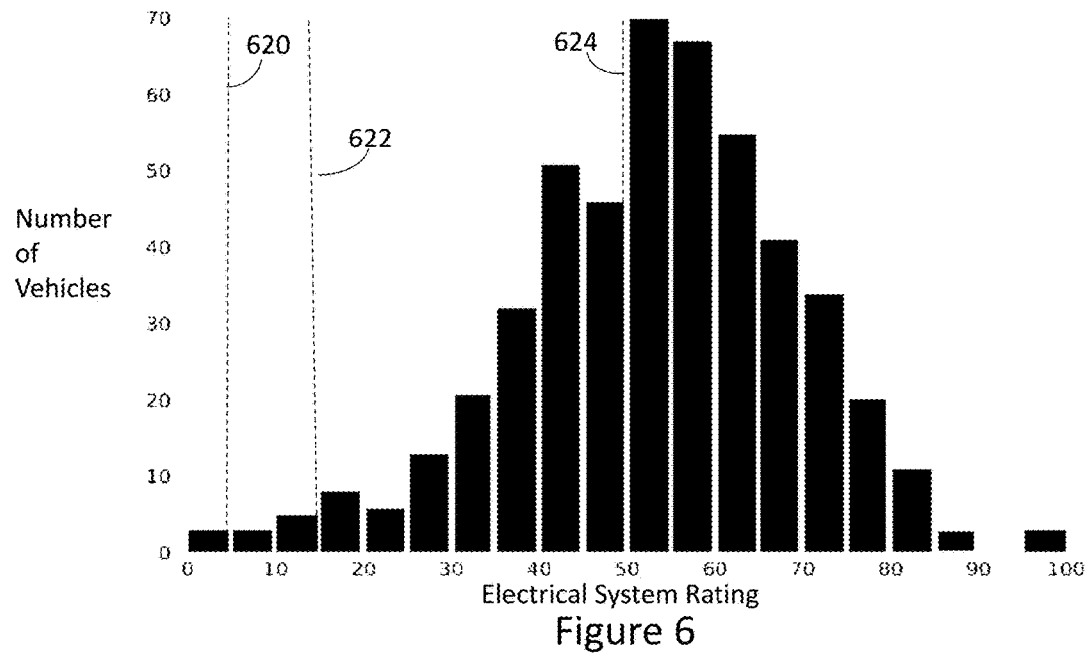
FIG. 6 is a histogram which illustrates Electrical System Rating for a plurality of vehicles.

FIG. 6 is a histogram which illustrates Electrical System Rating for a plurality of vehicles (e.g., for a fleet of vehicles). For example, a management device such as management device 310 in FIG. 3 could communicate with a fleet of vehicles such as vehicles 320 in FIG. 3 (any appropriate number of vehicles could be included in the fleet). Method 400 in FIG. 4 can be performed for each vehicle in the fleet (or on a subgroup of vehicles in the fleet, if data on only the subgroup of vehicles is desired). As a result, an ESR value is obtained for each vehicle in the fleet or subgroup of vehicles (further, a history of ESR values for each vehicle is obtained by performing method 400 regularly for each vehicle and storing the results). The histogram of FIG. 6 shows the quantity of vehicles which have different ESR values. This is useful for a vehicle manager to quickly ascertain electrical performance of the fleet or subgroup of vehicles, for example to budget upcoming service work.

FIG. 6 shows threshold 620 at ESR value 5, threshold 622 at ESR value 15, and threshold 624 at ESR value 624. Thresholds 620, 622, and 624 are similar to thresholds 520, 522, and 524, respectively, in FIG. 5. Description of thresholds 520, 522, and 524 is applicable to thresholds 620, 622, and 624, as is description of the nominal delineations therebetween (i.e. the "Poor", "Cautionary", "Fair", and "Good" delineations). With the data in FIG. 6, a vehicle manager can determine (or at least one processor can determine, and present to the vehicle manager) that 3 vehicles have an ESR of 0 (0.6% of the fleet or subgroup of vehicles), and 13 vehicles have an ESR less than 15 (2.6% of the fleet or subgroup of vehicles).

The specific delineations, and data results in FIG. 6 are merely exemplary. Any appropriate delineations could be implemented as appropriate for a given application, and the shape of the histogram and nature of data will change based on a given application.

Figure 7:
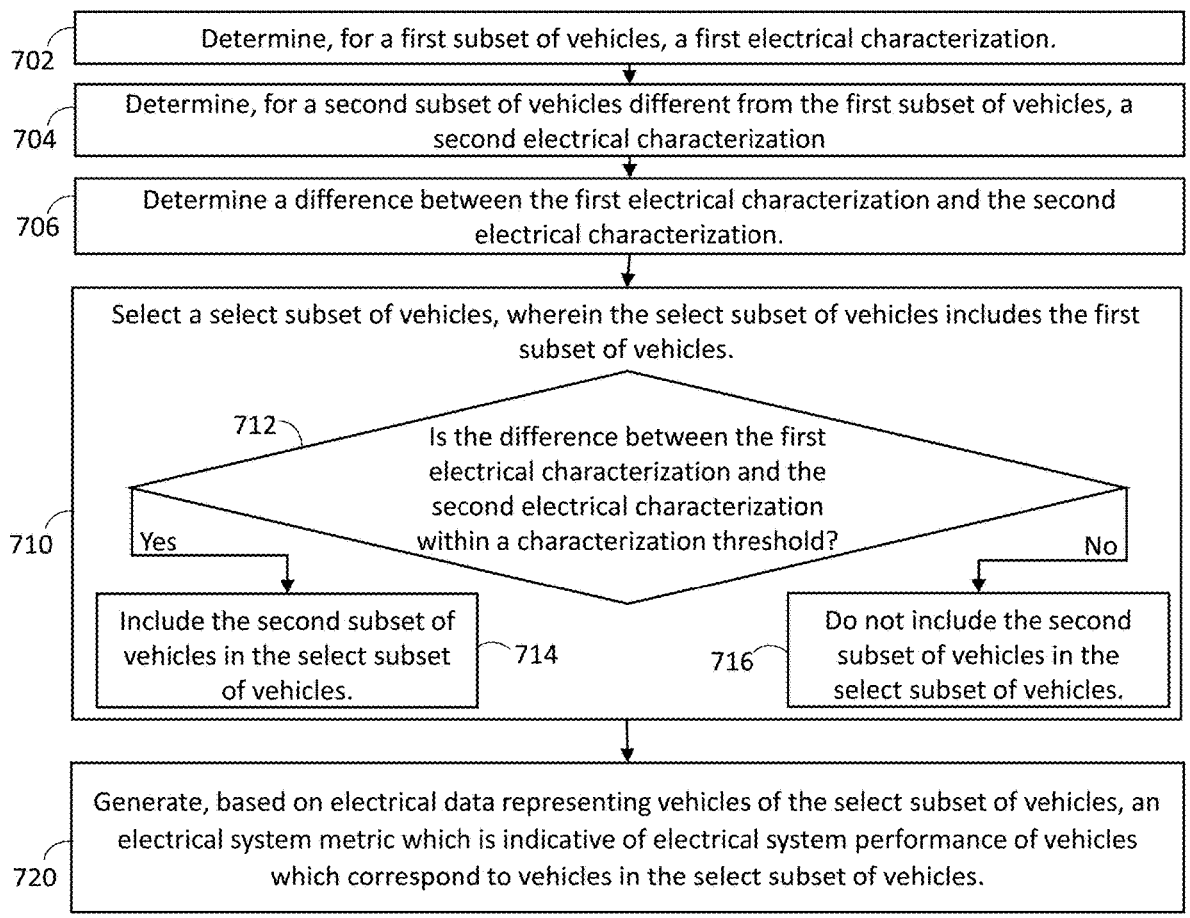
FIG. 7 is a flowchart diagram which illustrates an exemplary method for generating an electrical system metric.

FIG. 7 is a flowchart diagram which illustrates an exemplary method 700. Method 700 as illustrated includes acts 702, 704, 706, 710, 712, 714, 716, and 720. One skilled in the art will appreciate that additional acts could be added, acts could be removed, or acts could be reordered as appropriate for a given application. With reference to the example illustrated in FIG. 3, acts can be performed by appropriate components of management device 310, device 330, or any other appropriate device which receives data from a plurality of vehicles. Further, any appropriate at least one non-transitory processor-readable storage medium (such as the at least one non-transitory processor-readable storage medium 316 or 336) could have instructions stored thereon, which when executed by a respective at least one processor (e.g. the at least one processor 314 or 334) cause the respective management device 310 or device 330 to perform a given act of method 700. Generally, acts of determining, processing, identifying, comparing, or generating are performed by at least one processor (e.g. the at least one processor 314 or 334). In an exemplary implementation, acts 702, 704, 706, 710 (including 712, 714 and 716) and 720 can be performed by at least one processor (e.g. the at least one processor 314 or 334).

At 702, a first electrical characterization is determined for a first subset of vehicles. The first subset of vehicles is a plurality of vehicles which are similar. For example, the first subset of vehicles can include a plurality of vehicles which are of the same make (manufacturer), fuel type (e.g. gasoline or diesel), weight class, model, and engine. The first electrical characterization is based on at least one measured electrical parameter, such as the electrical parameters discussed above (e.g., the at least one electrical parameter can include cranking voltage for vehicles of the first subset of vehicles). The first electrical characterization can represent average or typical properties of electrical systems in the first subset of vehicles. For example, the first electrical characterization can be a distribution of cranking voltage values, which range from cranking voltages of vehicles which fail to start, to cranking voltages for vehicles with brand-new batteries. The first electrical characterization is useful to determine electrical properties of vehicles of the same type of the vehicles in the first subset of vehicles. For example, a measured electrical parameter for a given vehicle can be compared to the first electrical characterization, to assess electrical performance of the given vehicle against a plurality of other similar vehicles. Such an assessment can provide an indication of electrical health of the given vehicle, and can be used to estimate time until component failure in the given vehicle. An example of determining an electrical characterization of a subset of vehicles is discussed later with reference to FIG. 8.

Accuracy of the first electrical characterization is proportional to the number of vehicles in the first set of vehicles. That is, the sample size of vehicles on which the first electrical characterization is based influences accuracy of the first electrical characterization. If the sample size is small, assessments and estimation based on the first electrical characterization my not be sufficiently accurate. To address this issue, the sample size can be expanded to include additional vehicles, as is the topic of method 700 in FIG. 7.

At 704, a second electrical characterization is determined for a second subset of vehicles different from the first subset of vehicles. For example, the first subset of vehicles may be limited to vehicles of the same make, fuel type, weight class, model, and engine. On the other hand, the second subset of vehicles may include vehicles of the same make, fuel type, weight class, and model as the first subset of vehicles, but the second subset of vehicles may include vehicles with a different engine from the first subset of vehicles. This delineation between the first and second subsets is merely an example, and the first and second subset of vehicles could include vehicles which different from each other in any appropriate number of categories. The second electrical characterization can be determined in the same manner as the first electrical characterization, but instead based on the second subset of vehicles. An example of determining an electrical characterization of a subset of vehicles is discussed later with reference to FIG. 8.

At 706, a difference between the first electrical characterization and the second electrical characterization is determined. Examples are discussed later with reference to FIGS. 9A-9D, 10-10D, 11, and 12.

At 710, a select subset of vehicles is selected, where the select subset of vehicles includes at least the first subset of vehicles. If the difference between the first electrical characterization and the second electrical characterization is within a characterization threshold (at 712), the second subset of vehicles is also included in the select subset of vehicles (as shown at 714). That is, if the first subset of vehicles and the second subset of vehicles have similar enough electrical characterizations, they can be combined together in a select subset of vehicles, which has a larger sample size than the first subset of vehicles alone. On the other hand, if the difference between the first electrical characterization and the second electrical characterization is NOT within a characterization threshold (at 712), the second subset of vehicles is NOT included in the select subset of vehicles (as shown at 716). That is, if the first subset of vehicles and the second subset of vehicles do not have similar enough electrical characterizations, the second subset of vehicles will not be combined with the first subset of vehicles, to prevent data from the second subset of vehicles resulting in a metric which is not accurate to the first subset of vehicles. Exemplary characterization thresholds are discussed later with reference to FIGS. 9A-9D, 10-10D, 11, and 12.

At 720, an electrical system metric is generated based on electrical data representing vehicles of the select subset of vehicles (e.g., at least one measure parameter of vehicles in the select subset of vehicles). For example, the electrical system metric can comprise the Electrical System Rating (ESR) metric discussed above with reference to FIGS. 5 and 6, and discussed later with reference to FIGS. 13 and 14. The electrical system metric is indicative of electrical system performance of vehicles which correspond to vehicles in the select subset of vehicles. In the example of the ESR metric, electrical performance of vehicles of the same type of vehicles included in the select subset of vehicles can be determined. That is, a given vehicle may be of the same make, fuel type, weight class, model, and engine as the vehicles in the first subset of vehicles (or the second subset of vehicles, if included in the select subset of vehicles), and electrical system performance of the given vehicle can be determined based on the electrical system metric generated in method 700. The given vehicle itself does not have to be included in the select subset of vehicles which were used to generate the metric (although it can be); rather the given vehicle may only correspond to vehicles in the select subset of vehicles.

FIGS. 8, 9A-9D, and 10-10D discussed below illustrate an exemplary methodology for determining an electrical characterization, such as the first electrical characterization in act 702 of method 700, or the second electrical characterization in act 704 of method 700. The techniques discussed are generally appropriate for determining an electrical characterization for any plurality of vehicles (not just the first subset of vehicles or the second subset of vehicles). Further, determining the first electrical characterization and the second electrical characterization as described with reference to FIG. 7 is merely exemplary, and any appropriate methodology could be used to determine the first and second electrical characterizations (or other electrical characterizations discussed herein).

Figure 8:
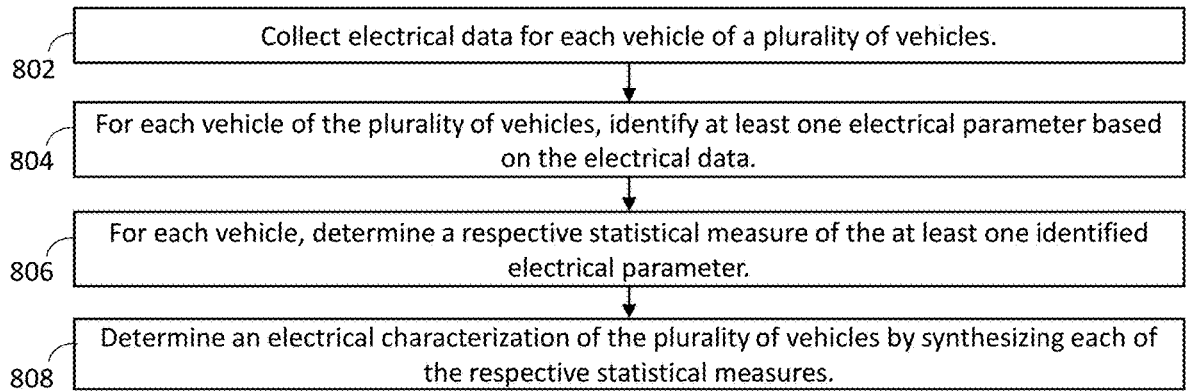
FIG. 8 is a flowchart diagram which illustrates an exemplary method for determining an electrical characterization of a subset of vehicles.

FIG. 8 is a flowchart diagram which illustrates an exemplary method 800. Method 800 as illustrated includes acts 802, 804, 806, and 808. One skilled in the art will appreciate that additional acts could be added, acts could be removed, or acts could be reordered as appropriate for a given application. With reference to the example illustrated in FIG. 3, acts can be performed by appropriate components of management device 310, device 330, or any other appropriate device which receives data from a plurality of vehicles. Further, any appropriate at least one non-transitory processor-readable storage medium (such as the at least one non-transitory processor-readable storage medium 316 or 336) could have instructions stored thereon, which when executed by a respective at least one processor (e.g. the at least one processor 314 or 334) cause the respective management device 310 or device 330 to perform a given act of method 800. Generally, acts of determining, processing, identifying, comparing, or generating are performed by at least one processor (e.g. the at least one processor 314 or 334). In an exemplary implementation, acts 804, 806, and 808 can be performed by at least one processor (e.g. the at least one processor 314 or 334).

At 802, electrical data is collected for each vehicle of a plurality of vehicles. As discussed above with reference to FIGS. 1 and 2, cranking voltage during a cranking event of a vehicle (ignition event when the vehicle is started) provides helpful information regarding the electrical performance of the vehicle (and in particular state of health of a vehicle electrical system). As such, the collected electrical data can include cranking voltages for the plurality of vehicles. The plurality of vehicles referred to in FIG. 8 can be the first subset of vehicles or the second subset of vehicles in method 700 of FIG. 7, or could be any other subset of vehicles for which an electrical characterization is performed. Collecting electrical data can include measuring voltage, current, or electrical patterns in each vehicle (such as by any appropriate sensors or sensing circuits). Measured electrical data can be collected by a transmission device, such as any of devices 322 in FIG. 3, a respective telematics monitoring device, or other device with communication capabilities. Collected electrical data can be sent to another device for analysis (such as management device 310 or device 330 in FIG. 3).

At 804, at least one electrical parameter is identified for each vehicle of the plurality of vehicles based on the collected electrical data. As an example, the at least one electrical parameter could pertain to cranking voltage during a cranking event. For example, the electrical parameter could be a voltage curve over a cranking event, or a voltage swing over a cranking event. As other examples, the electrical parameter could be more specific, such as minimum cranking voltage during the cranking event, or mean or median voltage during the cranking event, as discussed with reference to FIGS. 1 and 2). As another example, the electrical parameter could broadly be voltage of a vehicle over a period of time. The at least one electrical parameter for each vehicle can include a plurality of electrical parameters for each vehicle. For example, for a vehicle where the electrical data represents a plurality of cranking events for the vehicle, a respective electrical parameter can be identified for each cranking event. As another example, for a vehicle where the electrical data represents only one cranking event, one electrical parameter may be identified for the one cranking event.

At 806, for each vehicle, a statistical measure of the at least one electrical parameter identified in act 804 is determined. As an example, approximate quantiles of electrical parameters for a vehicle can be determined. With reference to an exemplary implementation where the at least one electrical parameter comprises voltage curve or voltage swing during cranking events, or just voltage of the battery of the vehicle over time, voltage quantiles can be determined. As a specific example, a 5th percentile voltage (statistical measure) can be identified from a year of data for voltages for a vehicle. This can be performed for each vehicle of the plurality of vehicles. A histogram (an example of electrical characterization as in act 808 discussed below) generated based on the determined fifth percentile voltages can be called a "5th Percentile Voltage Histogram", as referenced below. Determining 5th percentiles is merely exemplary, and any percentile or percentile range could be determined as appropriate for a given application. For example, a 95th percentile could be determined, and a corresponding histogram can be called a "95th Percentile Voltage Histogram".

As yet another example, standard deviation for electrical parameters for a vehicle can be determined as a statistical measure. With reference to an exemplary implementation where the at least one electrical parameter comprises vehicle battery voltage, voltage curve over a cranking event, voltage swing over a cranking event, minimum cranking voltage during the cranking event, or mean or median voltage during the cranking event, a standard deviation of voltage for a period of time (or a plurality of cranking events) can be determined for each vehicle of the plurality of vehicles. A histogram (an example of electrical characterization as in act 808 discussed below) generated based on the determined standard deviations can be called a "Standard Deviation Voltage Histogram", as referenced below.

At 808, An electrical characterization of the plurality of vehicles is generated by synthesizing each of the respective statistical measures determined in act 806. As one example, a distribution (e.g. a probability density function or histogram) is generated representing the plurality of vehicles, with examples discussed below.

Figure 9A:
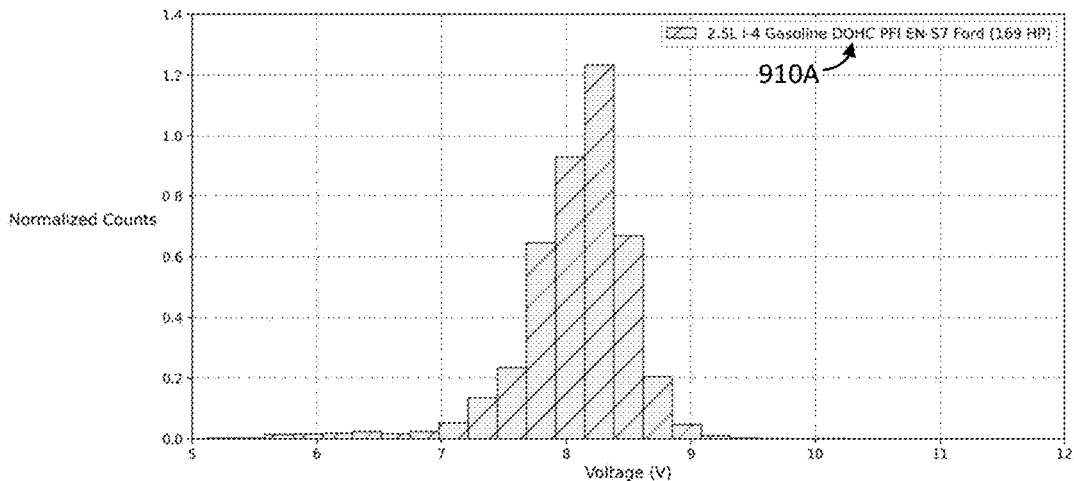
FIGS. 9A, 9B, 9C, 9D, 10A, 10B, 10C, and 10D shows histograms for different subsets of vehicles.
Figure 9B:
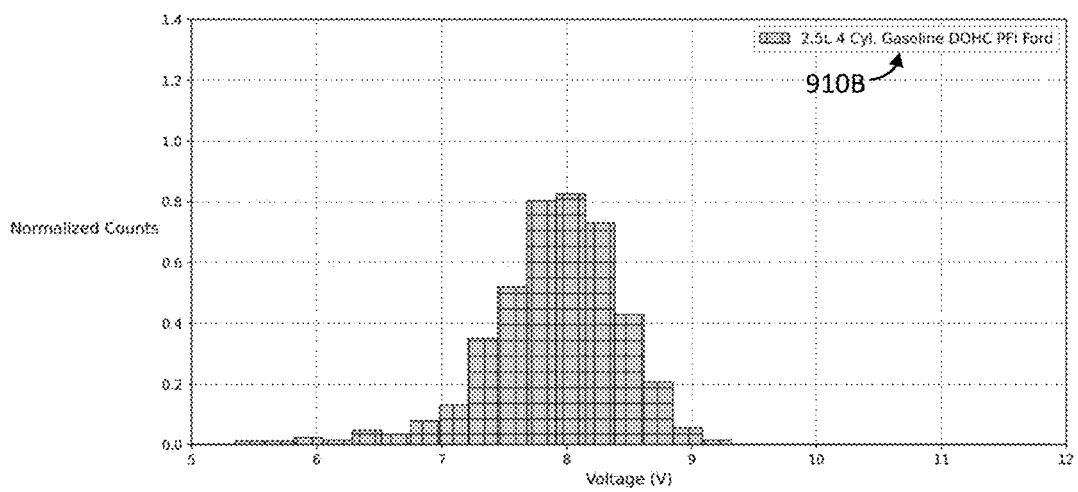
Figure 9C:
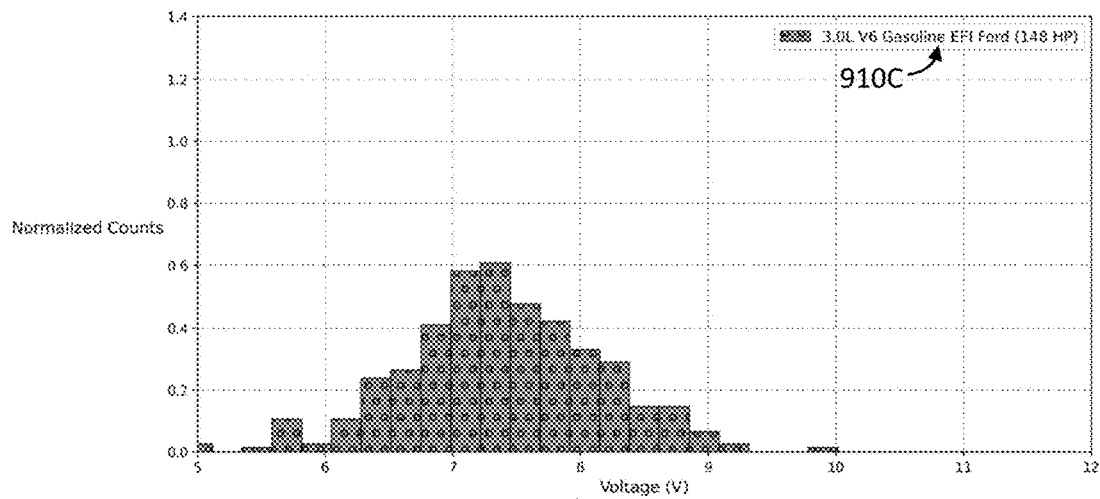
Figure 9D:
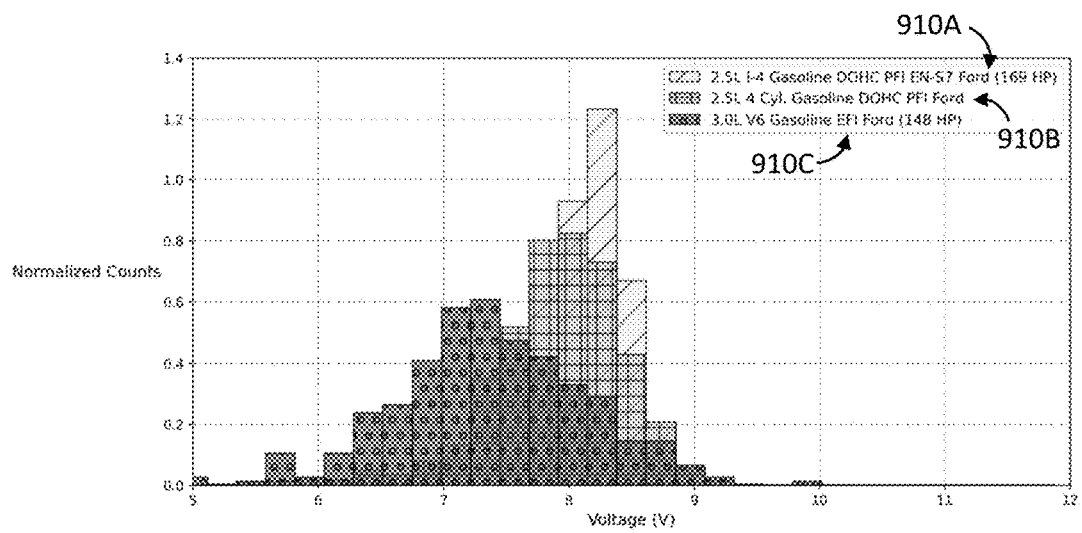
Figure 10A:
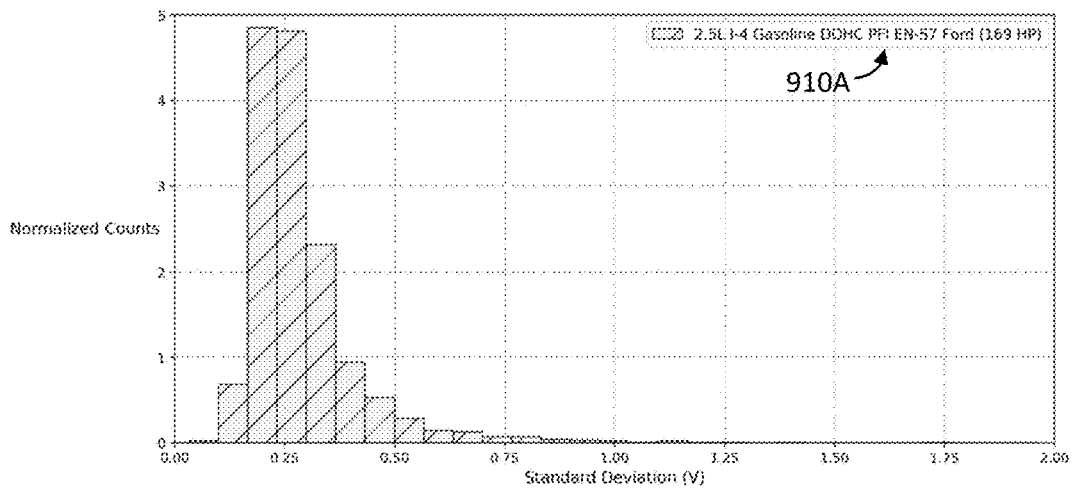
Figure 10B:
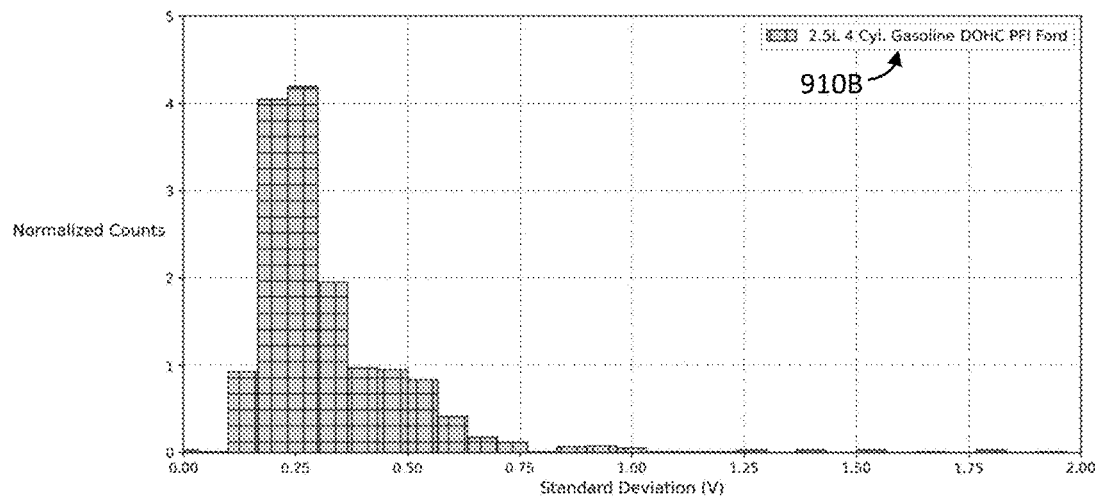
Figure 10C:
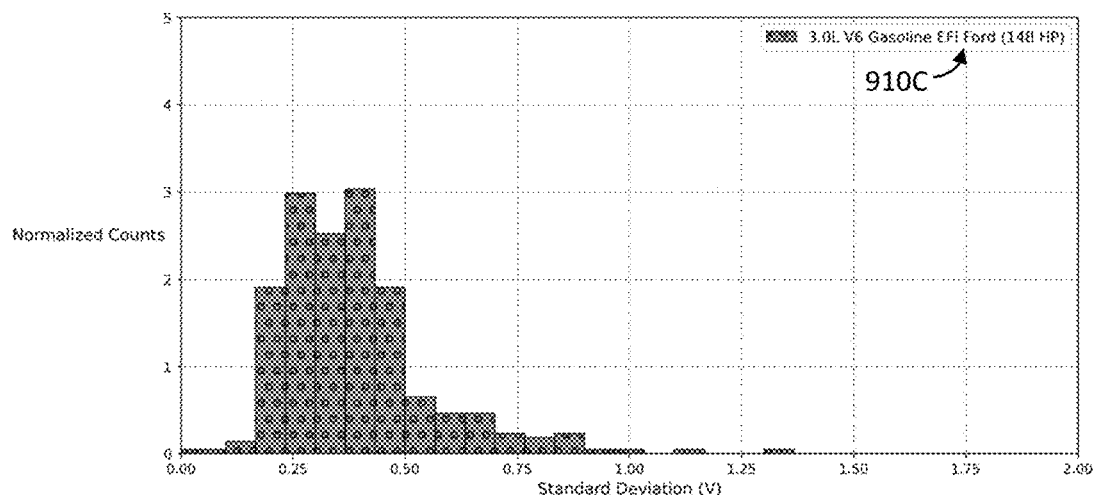
Figure 10D:
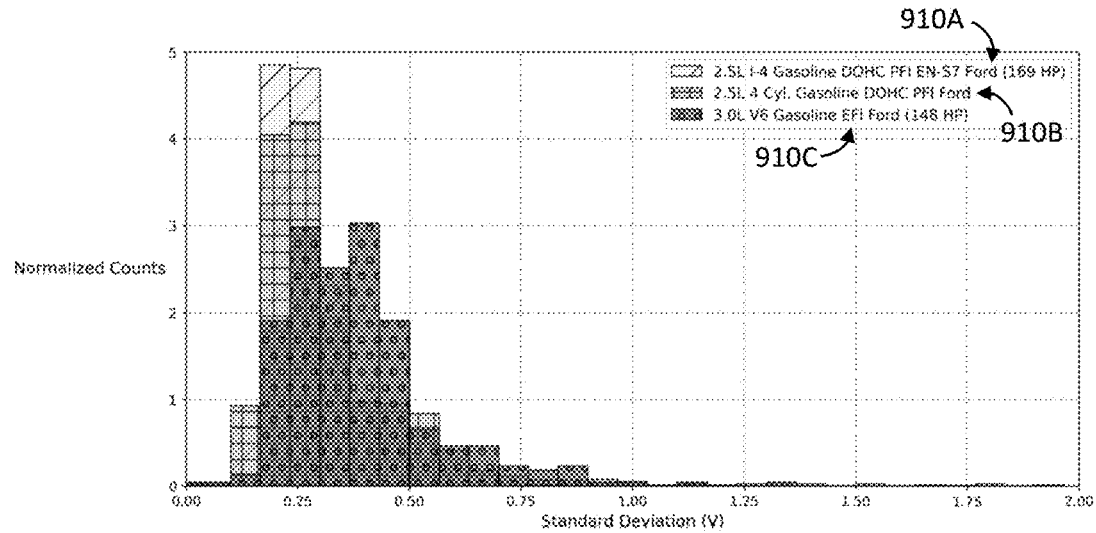

FIGS. 9A, 9B, 9C, 9D, 10A, 10B, 10C, and 10D are plots showing a variety of histograms. FIGS. 9A, 9B, and 9C show electrical characterizations generated in accordance with method 800 in FIG. 8, and in particular illustrate $5^{th}$ Percentile Voltage Histograms for three different pluralities of vehicles (subsets of vehicles in method 700). That is, in FIGS. 9A, 9B, and 9C, the "statistical measure" in act 806 of method 800 refers to determined $5^{th}$ percentile voltages for each respective vehicle. FIG. 9D is a plot which shows the histograms of FIGS. 9A, 9B, and 9C superimposed. FIGS. 10A, 10B, and 10C show electrical characterizations generated in accordance with method 800 in FIG. 8, and in particular illustrate Standard Deviation Histograms for voltages for a plurality of vehicles, generated in accordance with method 800 in FIG. 8. That is, in FIGS. 10A, 10B, and 10C, the "statistical measure" in act 806 of method 800 refers to determined standard deviation for each respective vehicle. FIG. 10D is a plot which shows the histograms of FIGS. 10A, 10B, and 10C superimposed.

FIGS. 9A and 10A show histograms for one subset of vehicles 910A, where each vehicle in the subset of vehicles 910A is a Ford 2.5 L I-4 Gasoline DOHC PFI EN-S7. FIGS. 9B and 10B show histograms of one subset of vehicles 910B, where each vehicle in the subset of vehicles 910B is a Ford 2.5 L 4 Cyl. Gasoline DOHC PFI. FIGS. 9C and 10C show histograms of one subset of vehicles 910C, where each vehicle in the subset of vehicles 910C is a Ford 3.0 L V6 Gasoline EFI. That is, each vehicle in the subset of vehicles 910A shown in FIGS. 9A and 10A is of the same make, fuel type, weight class, model, and engine. Similarly, each vehicle in the subset of vehicles 910B shown in FIGS. 9B and 10B is of the same make, fuel type, weight class, model, and engine. Similarly, each vehicle in the subset of vehicles 910C shown in FIGS. 9C and 10C is of the same make, fuel type, weight class, model, and engine. The three subsets of vehicles shown in FIGS. 9A and 10A, 9B and 10B, and 9C and 10C are differentiated by the engines of the vehicles in the subsets. That is, vehicles in the subset of vehicles 910A of FIGS. 9A and 10A have different engines from the subsets of vehicles 910B and 910C of FIGS. 9B, 10B, 9C, and 10C; vehicles in the subset of vehicles 910B of FIGS. 9B and 10B have different engines from the subsets of vehicles 910A and 910C of FIGS. 9A, 10A, 9C, and 10C; and vehicles in the subset of vehicles 910C of FIGS. 9C and 10C have different engines from the subsets of vehicles 910A and 910B of FIGS. 9A, 10A, 9B, and 10B. Differences between electrical characterizations of these subsets can be determined as in act 706 of method 700, to determine whether vehicles from the different subsets can be grouped together in a select subset of vehicles as in act 710 of method 700. Examples of this are discussed below with reference to FIGS. 9D and 10D.

FIG. 9D is a plot which illustrates the histograms representing subsets of vehicles 910A, 910B, and 910C (the histograms of FIGS. 9A, 9B, and 9C, respectively) superimposed. As can be seen in FIG. 9D, the histograms for the subset of vehicles 910A and 910B resemble each other, whereas the histogram for the subset of vehicles 910C appears different. It is desirable to determine, in a quantifiable way, whether subsets of vehicles are similar enough to group into a select subset of vehicles as discussed earlier with reference to FIG. 7. With reference to method 800 in FIG. 8, in act 808, synthesizing each of the respective statistical measures can include: determining at least one of a mean, a median, or a standard deviation for all of the statistical measures. Further, synthesizing each of the respective statistical measures can include: determining each of a mean, a median, and a standard deviation for all of the statistical measures. As examples, for each of the histograms shown in FIGS. 9A, 9B, 9C, 10A, 10B, and 10C, a respective mean, median, and/or standard deviation can be determined for each histogram. That is, a mean, median, and/or standard deviation can be determined for the histogram representing the subset of vehicles 910A in FIG. 9A. Another mean, median, and/or standard deviation can be determined for the histogram representing the subset of vehicles 910B in FIG. 9B. Yet another mean, median, and/or standard deviation can be determined for the histogram representing the subset of vehicles 910C in FIG. 9C. Yet another mean, median, and/or standard deviation can be determined for the histogram representing the subset of vehicles 910A in FIG. 10A. Yet another mean, median, and/or standard deviation can be determined for the histogram representing the subset of vehicles 910B in FIG. 10B. Yet another mean, median, and/or standard deviation can be determined for the histogram representing the subset of vehicles 910C in FIG. 10C.

Determining a difference between electrical characterizations (as in act 706 of method 700 in FIG. 7) can comprise determining at least one of a first difference between respective means for a plurality of histograms, a second difference between respective medians for the plurality of histograms, and a third difference between respective standard deviations for the plurality of histograms. Selecting a subset of vehicles, as in act 710 of method 700, can comprise determining whether respective the first difference, the second difference, and/or the third difference are within a respective mean threshold, median threshold, and/or standard deviation threshold.

In some implementations, whether certain subsets of vehicles are included in the select subset of vehicles can be based on at least one of the first difference, the second difference, or the third difference. For example, different subsets of vehicles could be included in the select subset of vehicles as long as one of: the first difference is within a mean threshold, the second difference is within a median threshold, or the third difference is within a standard deviation threshold.

In other implementations, whether certain subsets of vehicles are included in the select subset of vehicles can be based on all of the first difference, the second difference, or the third difference. For example, different subsets of vehicles could be included in the select subset of vehicles as long as each of: the first difference is within a mean threshold, the second difference is within a median threshold, and the third difference is within a standard deviation threshold. As another example, the first difference, the second difference, and the third difference can be components of a vector, and different subsets of vehicles could be included in the select subset of vehicles as long as the length of the vector (vector distance) is within a vector distance threshold.

Several general implementations are discussed above regarding how to determine whether different subset of vehicles are included in a select subset of vehicles. The implementations are discussed in greater detail below, with specific reference to the histograms illustrated in FIGS. 9A, 9B, and 9C, though the discussion is applicable to other histograms (such as the histograms in FIGS. 10A, 10B, and 10C), or any other sets of data synthesized according to act 808 in method 800 of FIG. 8.

In this illustrative example, the subset of vehicles 910A is the first subset of vehicles in method 700. The purpose of method 700 may be to determine whether data for any subsets of vehicles besides the first subset of vehicles 910A should be included in an electrical system metric used to assess electrical performance of vehicles corresponding to the first subset of vehicle 910A. As a result, the select subset of vehicles in act 710 by default includes the first subset of vehicles.

For the first subset of vehicles 910A, in act 702 a first electrical characterization is determined (e.g. by method 800 in FIG. 8). In this example, a first mean, first median, and first standard deviation are determined for the first subset of vehicles 910A.

In this exemplary implementation the subset of vehicles 910B in FIG. 9B is the second subset of vehicles in method 700. That is, the subset of vehicles 910B is evaluated to determine suitability for inclusion in the select subset of vehicles. To this end, in act 704 a second electrical characterization is determined (e.g. by method 800 in FIG. 8). In the example, a second mean, second median, and second standard deviation are determined for the second subset of vehicles 910B.

At 706, a difference between the first electrical characterization and the second electrical characterization is determined, and at 712 this difference is compared to a characterization threshold. Several examples of this are discussed above, and presented more specifically here. In a first example, determining the difference between the first electrical characterization and the second electrical characterization comprises determining a first difference between the first mean and the second mean, a second difference between the first median and the second median, and a third difference between the first standard deviation and the second standard deviation. Further, the characterization threshold includes a mean threshold, and median threshold, and a standard deviation threshold. In some implementations, the second subset of vehicles 910B can be included in the select subset of vehicles as per act 714 if at least one of the first difference is within the mean threshold, the second difference is within the median threshold, or the third difference is within the standard deviation threshold. In other implementations, the second subset of vehicles 910B can be included in the select subset of vehicles as per act 714 if each of the first difference is within the mean threshold, the second difference is within the median threshold, and the third difference is within the standard deviation threshold. As an example, each of the mean threshold, the median threshold, and the standard deviation threshold can be set at 1% (though other threshold values are within the scope of the present disclosure). This is satisfied for the subset of vehicles 910A and 910B discussed herein, and so the first subset of vehicles 910A and the second subset of vehicles 910B are included in the select subset of vehicles per act 714. However, if this were not satisfied for the subsets of vehicles 910A and 910B discussed herein, the first subset of vehicles 910A is included in the select subset of vehicles, but the second subset of vehicles would not be included in the select subset of vehicles per act 716.

The above examples discuss only a first subset of vehicles and a second subset of vehicles. However, it is desirable to be able to compare many subsets of vehicles, to find similar subsets to group together in the select subset of vehicles. Examples of analysis of a third subset of vehicles, and any other appropriate additional subsets of vehicles, are discussed below.

A third subset of vehicles different from the first subset of vehicles and the second subset of vehicles can be analyzed similarly to how the second subset of vehicles is analyzed in method 700 in FIG. 7. Description of analysis of the second subset of vehicles is applicable to the third subset of vehicles unless context dictates otherwise. In particular, a third electrical characterization can be determined for the third subset of vehicles, similar to act 704 of method 700 in FIG. 7. Similar to act 706 in method 700, a difference can be determined between the first electrical characterization and the third electrical characterization. Similarly to act 710 in method 700 a select subset of vehicles can be selected which includes the first subset of vehicles. At 712, if the difference between the first electrical characterization and the third electrical characterization is within a characterization threshold, the third subset of vehicles is included in the select subset of vehicles as in act 714. On the other hand, at 712 if the difference between the first electrical characterization and the third electrical characterization is not within a characterization threshold, the third subset of vehicles is not included in the select subset of vehicles as in act 716.

To discuss the specific example of FIGS. 9C and 10C, the subset of vehicles 910C in FIG. 9C can be considered as the third subset of vehicles. That is, the subset of vehicles 910C is evaluated to determine suitability for inclusion in the select subset of vehicles. To this end, a third electrical characterization is determined (similarly to act 704, e.g. by method 800 in FIG. 8) for the third subset of vehicles 910C. In the example, a third mean, third median, and third standard deviation are determined for the third subset of vehicles 910C.

A difference between the first electrical characterization and the third electrical characterization is determined (similar to act 706), and this difference is compared to a characterization threshold (similar to act 710). Several examples of this are discussed above, and are applicable here. In one example, determining the difference between the first electrical characterization and the third electrical characterization comprises determining a fourth difference between the first mean and the third mean, a fifth difference between the first median and the third median, and a sixth difference between the first standard deviation and the third standard deviation. Further, in this example the characterization threshold includes a mean threshold, and median threshold, and a standard deviation threshold. In some implementations, the third subset of vehicles 910C can be included in the select subset of vehicles if at least one of the fourth difference is within the mean threshold, the fifth difference is within the median threshold, or the sixth difference is within the standard deviation threshold. In other implementations, the third subset of vehicles 910C can be included in the select subset of vehicles if each of the fourth difference is within the mean threshold, the fifth difference is within the median threshold, and the sixth difference is within the standard deviation threshold. As an example similar to above, each of the mean threshold, the median threshold, and the standard deviation threshold can be set at 1% (though other threshold values are within the scope of the present disclosure). In the example of FIGS. 9C and 10C, unlike the subset of vehicles 910B, the subset of vehicles 910C does not satisfy these criteria (subset of vehicles 910C is too different from subset of vehicles 910A). As such, the third subset of vehicles 910C is not included in the select subset of vehicles (similar to act 716). However, if the third subset of vehicles 910C did satisfy the characterization threshold, the third subset of vehicles can be included in the select subset of vehicles similar to act 714.

In the above discussed examples, the select subset of vehicles can include the first subset of vehicles, and can include the second subset of vehicles and/or the third subset of vehicles, depending on whether the second subset of vehicles or the third subset of vehicles satisfy the characterization threshold.

In the examples discussed above, the first, second, third, fourth, fifth, and sixth differences are compared directly to a respective mean threshold, median threshold, and standard deviation threshold. In other examples, however, determining the difference between the first electrical characterization and the second electrical characterization in act 706 (or the third electrical characterization) comprises determining a vector distance, wherein the first (or fourth) difference, the second (or fifth) difference, and the third (or sixth) difference are vector components of the vector distance. The difference between the first electrical characterization and the second electrical characterization (or third electrical characterization) is not within the characterization threshold at 712 if the vector distance is not within a vector distance threshold, such that method 700 proceeds to act 716 and the second subset of vehicles (or third subset of vehicles) is not included in the select subset of vehicles. On the other hand, the difference between the first electrical characterization and the second electrical characterization (or the third electrical characterization) is within the characterization threshold at 712 if the vector distance is within the vector distance threshold, such that method 700 proceeds to act 714 and the second subset of vehicles (or the third subset of vehicles) is included in the select subset of vehicles.

Method 700 can be performed iteratively, comparing different subsets to each other, to determine which subsets can be grouped together in the select subset of vehicles for the purposes of generating an electrical system metric. This can extend beyond just first, second, and third subsets of vehicles. For example, for a plurality of additional subsets of vehicles, a respective additional electrical characterization for each additional subset of vehicles can be determined (e.g. according to method 800 discussed with reference to FIG. 8). A plurality of respective differences between the first electrical characterization and each respective additional electrical characterization can also be determined (similar to determining differences as discussed above). The select subset of vehicles can include each additional subset of vehicles for which the respective difference between the first electrical characterization and the respective additional electrical characterization is within the characterization threshold. The select subset of vehicles may not include each additional subset of vehicles for which the respective difference between the first electrical characterization and the respective additional electrical characterization is not within the characterization threshold. Any appropriate number of subsets of vehicles can be compared as discussed.

Many of the above examples discuss determining differences between electrical characterizations using means, medians, or standard deviations. However, other means of determining difference between electrical characterizations are applicable herein. For example, determining a difference between the first electrical characterization and the second electrical characterization as in act 706 of method 700 can comprise determining a difference between the first electrical characterization and the second electrical characterization using a distance function or a similarity metric. For example, the distance function can comprise a Wasserstein distance. In this context, such distance functions quantify how similar electrical characterizations of subsets of vehicles are. "Distance" is proportional to level of difference between two subsets of vehicles; that is, a greater distance between subsets is indicating of a great difference between electrical characterizations of the subsets. In implementations which use a distance function, the characterization threshold at 712 in method 700 in FIG. 7 includes a distance threshold. For subsets of vehicles where the difference between electrical characterizations is within the distance threshold, the subsets can both be included in the select subset of vehicles as in act 714 (i.e. the second subset of vehicles is included in the select subset of vehicles). For subsets of vehicles where the difference between electrical characterizations is not within the distance threshold, the subsets will not both be included in the select subset of vehicles as in act 716 (i.e. the second subset of vehicles is not included in the select subset of vehicles). In contexts where a similarity metric is used, difference can be determined as an inverse of similarity. Exemplary similarity metrics could include the Kolmogorov-Smirnov test or a chi-squared test.

Figure 11:
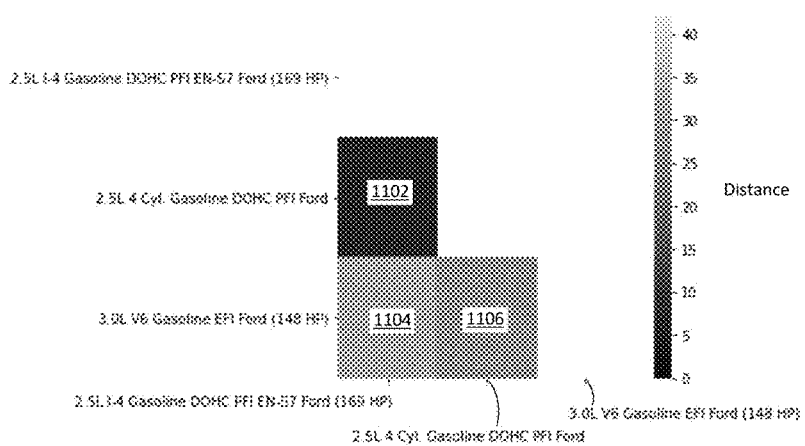
FIGS. 11 and 12 are pair-wise distance charts, which illustrate respective distances between pairs of subsets of vehicles.

FIG. 11 is a pair-wise distance chart, which illustrates respective distances between pairs of subsets of vehicles. In particular, FIG. 11 illustrates pair-wise distances between three vehicle subsets: a subset of Ford 2.5 L I-4 Gasoline DOHC PFI EN-S7 vehicles (subset of vehicles 910A in FIGS. 9A and 10A); another subset of Ford 2.5 L 4 Cyl. Gasoline DOHC PFI vehicles (subset of vehicles 910B in FIGS. 9B and 10B); and another subset of Ford 3.0 L V6 Gasoline EFI vehicles (subset of vehicles 910C in FIGS. 9C and 10C). Distance 1102 in FIG. 11 illustrates a distance between the subset of vehicles 910A and the subset of vehicles 910B. Distance 1104 in FIG. 11 illustrates a distance between the subset of vehicles 910A and the subset of vehicles 910C. Distance 1106 in FIG. 11 illustrates a distance between the subset of vehicles 910B and the subset of vehicles 910C. Each of the distances 1102, 1104, and 1106 in FIG. 11 can be calculated by a distance function, such as the Wasserstein distance or a distance calculation using the Kolmogorov-Smirnov test. As can be seen in FIG. 11, distance 1102 is near-zero, meaning the calculated distance (i.e. the difference in act 706 of method 700) between the subset of vehicles 910A and the subset of vehicle 910B is low. Thus, the subset of vehicles 910A and the subset of vehicles 910B can both be included in the select subset of vehicles in accordance with acts 710 and 714 in method 700. As can also be seen in FIG. 11, the distance 1104 and the distance 1106 are both relatively high (above 30), meaning that the calculated distance (i.e. the difference in act 706 of method 700) between the subset of vehicles 910C and the subsets of vehicles 910A and 910B is high. As a result, the subset of vehicles 910C may not be included in the select subset of vehicles with subsets of vehicles 910A and 910B in accordance with acts 710 and 716 in method 700.

Figure 12:
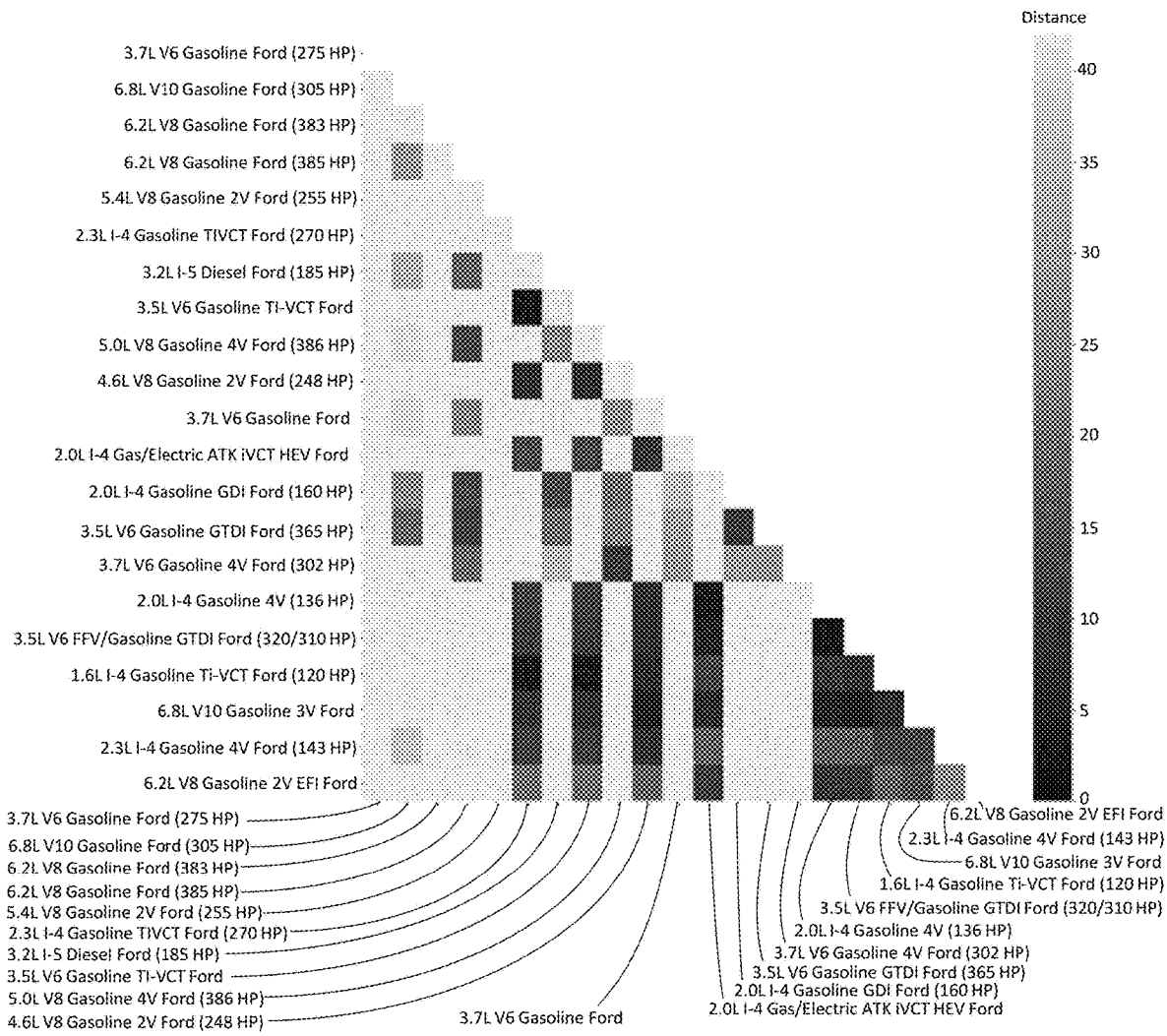

Comparison of subsets of vehicles as in FIG. 11 can be expanded to any appropriate number of subset of vehicles. FIG. 12 illustrates this, in that FIG. 12 is a pair-wise distance chart, which illustrates respective distances between pairs of twenty different subsets of vehicles. In FIG. 12, pairs of vehicle subsets which have a low distance (the intersection for the respective pair is illustrated darkly according to the distance scale), may be close enough to include in a common select subset of vehicles (depending on how strictly a characterization threshold is set). On the other hand, pairs of vehicle subsets which have a high distance (the intersection for the respective pair is illustrated lightly according to the distance scale), may be too far apart to include in a common select subset of vehicles (depending on how strictly a characterization threshold is set). The illustrated comparisons of twenty different subsets of vehicles is merely exemplary, and any number of subsets of vehicles coupled be compared as appropriate for a given application.

Several examples of characterization threshold are discussed above, where a difference between electrical characterizations is assessed against a characterization threshold as at 712 of method 700 in FIG. 7. However, characterization thresholds as discussed herein can be multi-faceted. In particular, in addition to assessing a difference between electrical characterizations for determining whether certain subsets of vehicles should be included in a select subset of vehicles, properties of the subsets of vehicles themselves can be analyzed to determine whether the subset of vehicles should be included in the select subset of vehicles. Several examples are discussed below.

As a first example, a characterization threshold can further comprise a vehicle ratio threshold. In this example, a subset of vehicles is considered not within the characterization threshold if a proportion of vehicles in the subset of vehicles which are owned by a single entity exceeds the vehicle ratio threshold. An "entity" could comprise for example, an individual, company, or fleet which owns vehicles. With reference to method 700 of FIG. 7, the second subset of vehicles can be considered as not within the characterization threshold if a proportion of vehicles in the second subset of vehicles which are owned by a single entity exceeds the vehicle ratio threshold. In such a case, the second subset of vehicles is not included in the select subset of vehicles in accordance with act 716 of method 700, even if the difference between the first electrical characterization and the second electrical characterization is small enough such that the second subset of vehicles would otherwise be included in the select subset of vehicles. Similar discussion applies to the third subset of vehicles and any additional subsets of vehicles as discussed above.

Not including a subset of vehicles where too great a ratio of the subset of vehicles are owned by a single entity can prevent systematic errors due to common vehicle ownership. For example, each vehicle in the subset of vehicles may be subject to similar maintenance routines, similar replacement parts, similar use patterns, or other similar scenarios, which influence electrical performance of the vehicle, and are therefore not necessarily accurate to the vehicle represented by the subset of vehicles when owned by other entities. In an exemplary implementation, the vehicle ratio threshold can be 60%. That is, a subset of vehicles may not be included in a select subset of vehicles if a single entity owns more than 60% of vehicles in the subset of vehicles. This is merely an example threshold, and any vehicle ratio threshold could be set as appropriate for a given application.

As a second example, a characterization threshold can further comprise a cranking event ratio threshold. In this example, a subset of vehicles is considered not within the characterization threshold if a proportion of cranking events in the electrical data from the subset of vehicles which are owned by a single entity exceeds the threshold cranking event ratio. With reference to method 700 of FIG. 7, the second subset of vehicles can be considered as not within the characterization threshold if a proportion of cranking events in data from the second subset of vehicles, for vehicles which are owned by a single entity, exceeds the cranking event ratio threshold. In such a case, the second subset of vehicles is not included in the select subset of vehicles in accordance with act 716 of method 700, even if the difference between the first electrical characterization and the second electrical characterization is small enough such that the second subset of vehicles would otherwise be included in the select subset of vehicles. Similar discussion applies to the third subset of vehicles and any additional subsets of vehicles as discussed above.

Not including a subset of vehicles where too great a ratio of cranking events correspond to vehicles which are owned by a single entity can prevent systematic errors due to common vehicle ownership. As in the first example, each vehicle in the subset of vehicles may be subject to similar maintenance routines, similar replacement parts, similar use patterns, or other similar scenarios, which influence electrical performance of the vehicle, and are therefore not necessarily accurate to the vehicle represented by the subset of vehicles when owned by other entities. Further, vehicles belonging to one entity may start (turn on) more often than vehicles belonging to other entities, such that the cranking events corresponding to vehicles owned by the one entity overwhelm other entities in the electrical data. In an exemplary implementation, the cranking event ratio threshold can be 70%. That is, a subset of vehicles may not be included in a select subset of vehicles if vehicles owned by a single entity are responsible for more than 70% of cranking events for the subset of vehicles. This is merely an example threshold, and any cranking event ratio threshold could be set as appropriate for a given application.

As a third example, a characterization threshold can further comprise a unique entity threshold. In this example, a subset of vehicles is considered not within the characterization threshold if a total number of unique entities which own vehicles in the subset of vehicles is below the unique entity threshold. With reference to method 700 of FIG. 7, the second subset of vehicles can be considered as not within the characterization threshold if the vehicles in the second subset of vehicles are owned by a number of unique entities less than the unique entity threshold. In such a case, the second subset of vehicles is not included in the select subset of vehicles in accordance with act 716 of method 700, even if the difference between the first electrical characterization and the second electrical characterization is small enough such that the second subset of vehicles would otherwise be included in the select subset of vehicles. Similar discussion applies to the third subset of vehicles and any additional subsets of vehicles as discussed above.

Not including a subset of vehicles where the vehicles in the subset of vehicles are owned by too few entities can prevent systematic errors due to common vehicle ownership. As in the above examples, each vehicle in the subset of vehicles may be subject to similar maintenance routines, similar replacement parts, similar use patterns, or other similar scenarios, which influence electrical performance of the vehicle, and are therefore not necessarily accurate to the vehicle represented by the subset of vehicles when owned by other entities. In an exemplary implementation, the unique entity threshold can be 3 entities. That is, a subset of vehicles may not be included in a select subset of vehicles if the vehicles in the subset of vehicles are owned by less than 3 entities. This is merely an example threshold, and any unique entity threshold could be set as appropriate for a given application.

As a fourth example, a characterization threshold can further comprise a sample size threshold. In this example, a subset of vehicles is considered not within the characterization threshold if a total number of vehicles in the subset of vehicles is below the sample size threshold. With reference to method 700 of FIG. 7, the second subset of vehicles can be considered as not within the characterization threshold if there are fewer vehicles in the second subset of vehicles than the sample size threshold. In such a case, the second subset of vehicles is not included in the select subset of vehicles in accordance with act 716 of method 700, even if the difference between the first electrical characterization and the second electrical characterization is small enough such that the second subset of vehicles would otherwise be included in the select subset of vehicles. Similar discussion applies to the third subset of vehicles and any additional subsets of vehicles as discussed above.

Not including a subset of vehicles where there are too few vehicles in the subset of vehicles can prevent errors due to outlier vehicles. In particular, a small sample size of vehicles will be more prone to inaccuracies cause by a small number of vehicles which are not accurately representative of the subset of vehicles. In an exemplary implementation, the sample size threshold can be 50 vehicles. That is, a subset of vehicles may not be included in a select subset of vehicles if the subset of vehicles includes data from fewer than 50 vehicles. This is merely an example threshold, and any sample size threshold could be set as appropriate for a given application.

Regardless of the above vehicle ratio threshold, cranking event ratio threshold, unique entity threshold, and sample size threshold, the first subset of vehicles can be at least partially included in the select subset of vehicles, because otherwise there would be no data for generating the electrical system metric for the first subset of vehicles. However, certain data from the first subset of vehicles could be omitted to balance entity ownership of vehicles if needed. As an example, if vehicles in a first subset of vehicles are predominantly owned by a single entity, a portion of the vehicles owned by this entity could be omitted from the select subset of vehicles, to balance ownership ratio in the select subset of vehicles. Similar discussion applies to the cranking event ratio threshold.

The characterization thresholds discussed herein could include any number of appropriate thresholds, and any appropriate types of threshold, as appropriate for a given application. In one exemplary implementation, in addition to threshold pertaining to difference between electrical characterizations, a characterization threshold could include at least one of, a plurality of, or all of: a threshold vehicle ratio, a threshold cranking event ratio, a unique entity threshold, and a sample size threshold.

Act 720 of method 700 in FIG. 7 comprises generating, based on electrical data representing vehicles of the select subset of vehicles, an electrical system metric which is indicative of electrical system performance of vehicles which correspond to vehicles in the select subset of vehicles, as discussed earlier. Exemplary techniques for generating the electrical system metric are discussed below with reference to FIGS. 13 and 14.

Figure 13:
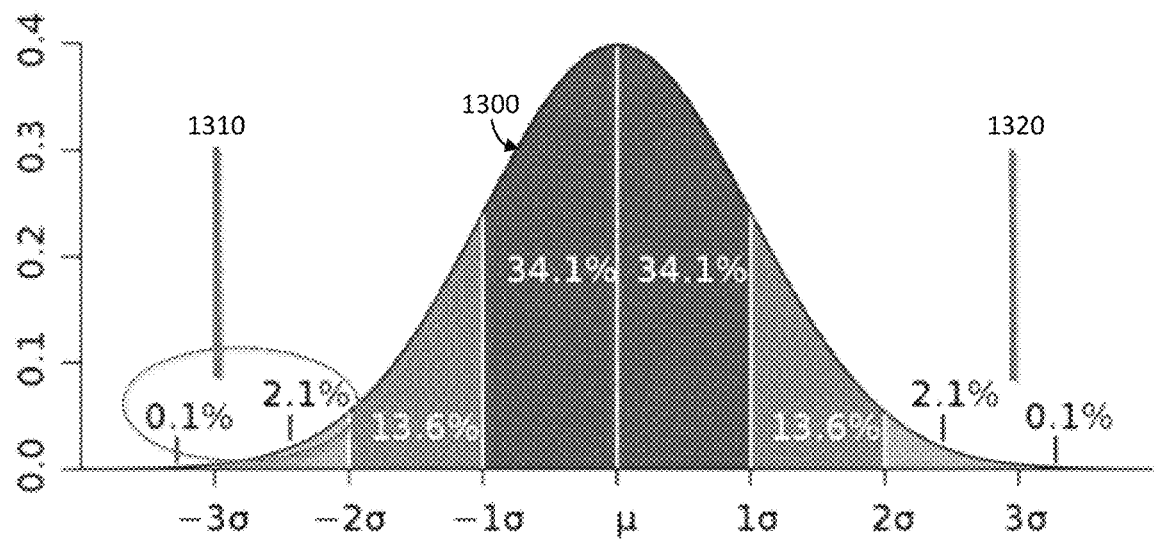
FIG. 13 illustrates an exemplary normalized Gaussian distribution representative of a histogram for a select subset of vehicles.

FIG. 13 illustrates an exemplary normalized Gaussian distribution 1300. The distribution of FIG. 13 is representative of a histogram for a select subset of vehicles, the vehicles binned and plotted in accordance with at least one measured electrical parameter (a detailed example is discussed with reference to FIG. 14 below). The at least one electrical parameter could include any appropriate electrical parameter discussed herein, such as minimum cranking voltage, mean cranking voltage over a cranking event, voltage swing over a cranking event, etc. The horizontal axis shows standard deviation σ from a mean μ for the electrical parameter. As shown in FIG. 13, 34.1% of the vehicles have an electrical parameter between mean μ and a standard deviation of −1σ. Similarly, 34.1% of the vehicles have an electrical parameter between mean μ and a standard deviation of 1σ. 13.6% of the vehicles have an electrical parameter between a standard deviation of −1σ and −2σ from mean μ. Similarly, 13.6% of the vehicles have an electrical parameter between a standard deviation of 1σ and 2σ from mean μ. 2.1% of the vehicles have an electrical parameter between a standard deviation of −2σ and −3σ from mean μ. Similarly, 2.1% of the vehicles have an electrical parameter between a standard deviation of 2σ and 3σ from mean μ. 0.1% of the vehicles have an electrical parameter less than a standard deviation of −3σ from mean μ. Similarly, 0.1% of the vehicles have an electrical parameter greater than a standard deviation of 3σ from mean μ.

An electrical system metric can be generated to fit a distribution such as that shown in FIG. 13. For example, by design it may be desirable to generate an electrical system metric where approximately 2% of vehicles are identified as having electrical system performance below a certain threshold. In the case of FIG. 13, by setting a performance threshold of −2σ from mean μ, vehicles with electrical performance below −2σ from mean μ can be identified as being due for an electrical systems inspection or servicing. This will include 2.2% of the vehicles (2.1%+0.1%) as shown by lower limit 1310 in FIG. 13. A similar upper limit 1320 is also illustrated in FIG. 13, which includes vehicles having excellent electrical systems performance. Further, it is possible to set the performance threshold to any appropriate value, and is not limited to integer multiples of standard deviation σ. In one exemplary implementation, the "Poor" category discussed above could be set to be below −3σ from mean μ; the "Cautionary" category discussed above could be set to be between −3σ and −2σ from mean μ; the "Fair" category discussed above could be set to be between −2σ and mean μ; and the "Good" category discussed above could be set for values above mean μ. These delineations are merely exemplary, and any delineation thresholds, or number of delineations, could be chosen as appropriate for a given application.

Figure 14:
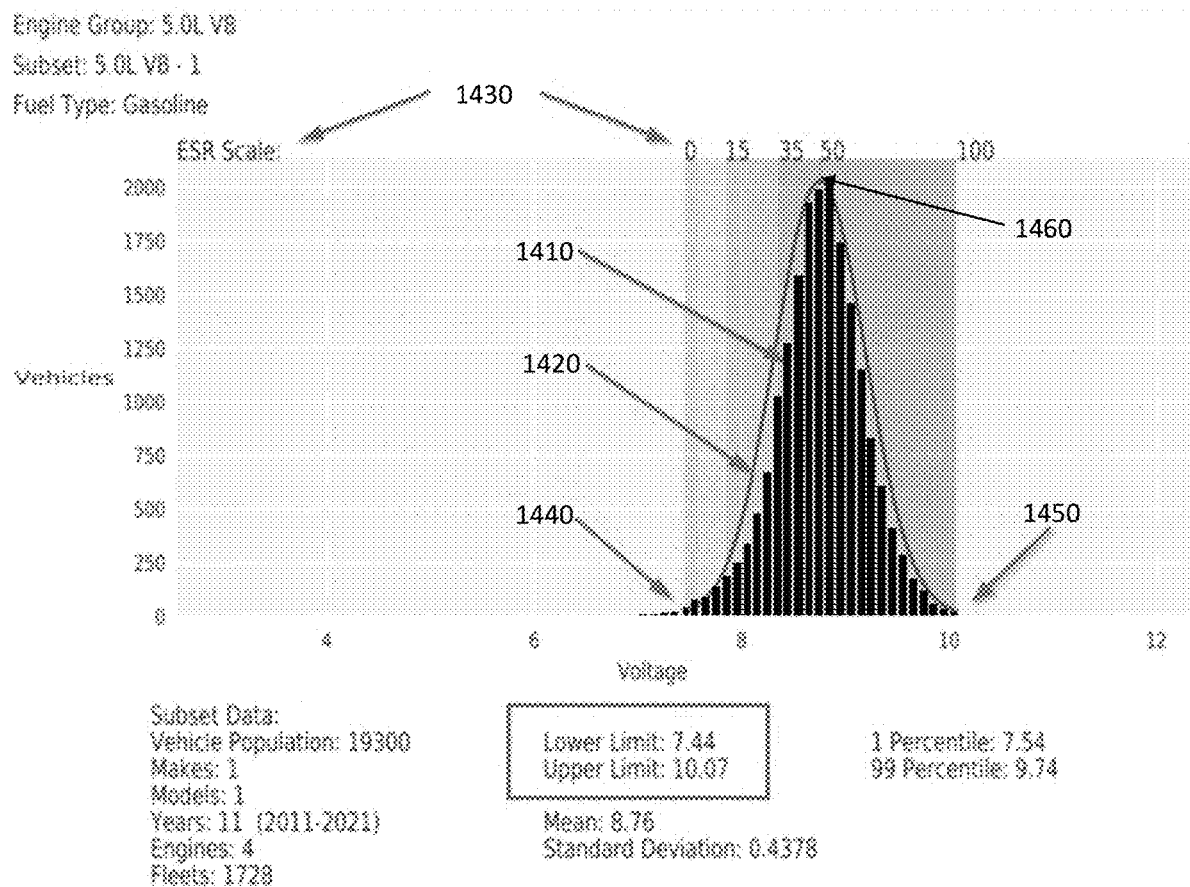
FIG. 14 is a plot which shows a histogram and a distribution for a select subset of vehicles.

FIG. 14 is a plot which shows a histogram 1410 for a select subset of vehicles, the vehicles binned and plotted in accordance with at least one measured electrical parameter. In the example, the electrical parameter is a minimum cranking voltage during cranking events, as shown on the horizontal axis. However, the vehicles could be plotted based on any other appropriate electrical parameter as discussed herein, such as mean voltage over a cranking event, or voltage swing over a cranking event. FIG. 14 also shows a Gaussian distribution 1420 fit to the histogram 1410. FIG. 14 also shows an Electrical System Rating (ESR) 1430, that is an electrical system metric, fit to the distribution 1420. A lower limit 1440 and an upper limit 1450 can be determined for the ESR 1430 as discussed above with reference to FIG. 13. For example, lower limit 1440 could be set at −3σ from mean μ, and upper limit 1450 could be set at 3σ from mean μ. For an electrical system metric which ranges from 0 to 100 (as with the illustrated ESR 1430), "0" for the electrical system metric can be set at the lower limit 1440, whereas "100" can be set as the upper limit 1450. Based on this, the electrical system metric is scaled to fit between lower limit 1440 and upper limit 1450 of distribution 1420. Optionally, the value "50" in the electrical system metric 1430 can be set at a peak 1460 of the distribution 1420 (or the mean μ of the histogram 1410). In this way, by measuring the electrical parameter for a vehicle, and comparing the measured electrical parameter to the electrical system metric, an indication of electrical system performance for the vehicle can be obtained relative to other similar vehicles. While it would be possible to set lower limit 1440 to the voltage of the lowest data point, and to set upper limit 1450 to the voltage of the highest data point, this may not accurately represent the normal range of voltages for the subset of vehicles. Rather, the lowest and highest data points may coincide with outlier cases which are exceptionally rare, and thus not a great basis for establishing a scale.

FIG. 14 also shows a plurality of data points of interest below the plot. In the "Subset Data" section, it is indicated that the subset of vehicles includes 19300 vehicles total, from 1 vehicle Maker, of one vehicle Model, spanning 11 Years of vehicles, 4 different engines, and 1728 different Fleets. Thus, FIG. 14 illustrates an example where several different subsets of vehicles are combined into a select subset of vehicles for the purposes of generating an electrical system metric.

While the present invention has been described with respect to the non-limiting embodiments, it is to be understood that the invention is not limited to the disclosed embodiments. Persons skilled in the art understand that the disclosed invention is intended to cover various modifications and equivalent arrangements included within the scope of the appended claims. Thus, the present invention should not be limited by any of the described embodiments.

Throughout this specification and the appended claims, infinitive verb forms are often used, such as "to operate" or "to couple". Unless context dictates otherwise, such infinitive verb forms are used in an open and inclusive manner, such as "to at least operate" or "to at least couple".

The specification includes various implementations in the form of block diagrams, schematics, and flowcharts. A person of skill in the art will appreciate that any function or operation within such block diagrams, schematics, and flowcharts can be implemented by a wide range of hardware, software, firmware, or combination thereof. As non-limiting examples, the various embodiments herein can be implemented in one or more of: application-specific integrated circuits (ASICs), standard integrated circuits (ICs), programmable logic devices (PLDs), field-programmable gate arrays (FPGAs), computer programs executed by any number of computers or processors, programs executed by one or more control units or processor units, firmware, or any combination thereof.

The disclosure includes descriptions of several processors. Said processor can be implemented as any hardware capable of processing data, such as application-specific integrated circuits (ASICs), standard integrated circuits (ICs), programmable logic devices (PLDs), field-programmable gate arrays (FPGAs), logic circuits, or any other appropriate hardware. The disclosure also includes descriptions of several non-transitory processor-readable storage mediums. Said non-transitory processor-readable storage mediums can be implemented as any hardware capable of storing data, such as magnetic drives, flash drives, RAM, or any other appropriate data storage hardware.

What is claimed is:

1. A system comprising:
   at least one processor; and
   at least one non-transitory processor-readable storage medium communicatively coupled to the at least one processor, the at least one non-transitory processor-readable storage medium storing processor-executable instructions which when executed by the at least one processor, cause the at least one processor to:
   determine, for a first subset of vehicles, a first electrical characterization;
   determine, for a second subset of vehicles different from the first subset of vehicles, a second electrical characterization;
   determine a difference between the first electrical characterization and the second electrical characterization;
   select a select subset of vehicles, wherein:
      the select subset of vehicles includes the first subset of vehicles;
      the select subset of vehicles includes the second subset of vehicles if the difference between the first electrical characterization and the second electrical characterization is within a characterization threshold which comprises a vehicle ratio threshold; and
      the select subset of vehicles does not include the second subset of vehicles if the difference between the first electrical characterization and the second electrical characterization is not within the characterization threshold, where the second subset of vehicles is not within the characterization threshold if a proportion of vehicles in the second subset of vehicles which are owned by a single entity exceeds the vehicle ratio threshold; and
   generate, based on electrical data representing vehicles of the select subset of vehicles, an electrical system metric which is indicative of electrical system performance of vehicles which correspond to vehicles in the select subset of vehicles.

2. The system of claim 1, wherein:
the processor-executable instructions which cause the at least one processor to determine, for the first subset of vehicles, the first electrical characterization, cause the at least one processor to:
   identify at least one first electrical parameter for each vehicle of the first subset of vehicles, based on electrical data collected for each vehicle of the first subset of vehicles;
   determine, for each vehicle of the first subset of vehicles, a respective first statistical measure of the respective at least one identified first electrical parameter; and
   determine the first electrical characterization of the first subset of vehicles by synthesizing each of the respective first statistical measures; and
the processor-executable instructions which cause the at least one processor to determine, for the second subset of vehicles, the second electrical characterization, cause the at least one processor to:
   identify at least one second electrical parameter for each vehicle of the second subset of vehicles, based on electrical data collected for each vehicle of the second subset of vehicles;
   determine, for each vehicle of the second subset of vehicles, a respective second statistical measure of the respective at least one identified second electrical parameter; and
   determine the second electrical characterization of the second subset of vehicles by synthesizing each of the respective second statistical measures.

3. The system of claim 2, wherein:
the processor-executable instructions which cause the at least one processor to determine the first electrical characterization of the first subset of vehicles by synthesizing each of the respective first statistical measures cause the at least one processor to: determine at least one of a first mean, a first median, or a first standard deviation for all of the first statistical measures; and
the processor-executable instructions which cause the at least one processor to determine the second electrical characterization of the second subset of vehicles by synthesizing each of the respective second statistical measures cause the at least one processor to: determine at least one of a second mean, a second median, or a second standard deviation for all of the second statistical measures.

4. The system of claim 3, wherein:
the processor-executable instructions which cause the at least one processor to determine at least one of the first mean, the first median, or the first standard deviation for all of the first statistical measures cause the at least one processor to determine each of the first mean, the first median, and the first standard deviation for all of the first statistical measures; and
the processor-executable instructions which cause the at least one processor to determine at least one of the second mean, the second median, or the second standard deviation for all of the second statistical measures cause the at least one processor to determine each of the second mean, the second median, and the second standard deviation for all of the second statistical measures.

5. The system of claim 4, wherein:
the processor-executable instructions which cause the at least one processor to determine the difference between the first electrical characterization and the second electrical characterization cause the at least one processor to determine a first difference between the first mean and the second mean, a second difference between the first median and the second median, and a third difference between the first standard deviation and the second standard deviation;
the characterization threshold further includes a mean threshold, a median threshold, and a standard deviation threshold;
the difference between the first electrical characterization and the second electrical characterization is not within the characterization threshold if the first difference is not within the mean threshold, the second difference is not within the median threshold, or the third difference is not within the standard deviation threshold; and
the difference between the first electrical characterization and the second electrical characterization is within the characterization threshold if the first difference is within the mean threshold, the second difference is within the median threshold, the third difference is within the standard deviation threshold, and the proportion of vehicles in the second subset of vehicles which are owned by a single entity does not exceed the vehicle ratio threshold.

6. The system of claim 4, wherein:
the processor-executable instructions which cause the at least one processor to determine the difference between the first electrical characterization and the second electrical characterization cause the at least one processor to:
determine a first difference between the first mean and the second mean, a second difference between the first median and the second median, and a third difference between the first standard deviation and the second standard deviation; and
determine a vector distance where the first difference, the second difference, and the third difference are vector components of the vector distance;
the difference between the first electrical characterization and the second electrical characterization is not within the characterization threshold if the vector distance is not within a vector distance threshold; and
the difference between the first electrical characterization and the second electrical characterization is within the characterization threshold if the vector distance is within the vector distance threshold and the proportion of vehicles in the second subset of vehicles which are owned by a single entity does not exceed the vehicle ratio threshold.

7. The system of claim 2, wherein:
each first electrical parameter corresponding to a respective vehicle of the first subset of vehicles comprises a respective cranking voltage during an ignition event of the respective vehicle of the first subset of vehicles; and
each second electrical parameter corresponding to a respective vehicle of the second subset of vehicles comprises a respective cranking voltage during an ignition event of the respective vehicle of the second subset of vehicles.

8. The system of claim 7, wherein each respective cranking voltage during an ignition event comprises a minimum vehicle battery voltage reached during the ignition event.

9. The system of claim 1, wherein:
the processor executable instructions further cause the at least one processor to determine, for a third subset of vehicles, a third electrical characterization;
the processor executable instructions further cause the at least one processor to determine a difference between the first electrical characterization and the third electrical characterization;
the select subset of vehicles includes the third subset of vehicles if the difference between the first electrical characterization and the third electrical characterization is within the characterization threshold; and
the select subset of vehicles does not include the third subset of vehicles if the difference between the first electrical characterization and the third electrical characterization is not within the characterization threshold, where the third subset of vehicles is not within the characterization threshold if a proportion of vehicles in the third subset of vehicles which are owned by a single entity exceeds the vehicle ratio threshold.

10. The system of claim 1, wherein:
the processor executable instructions further cause the at least one processor to determine, for a plurality of additional subsets of vehicles, a respective additional electrical characterization for each additional subset of vehicles;
the processor executable instructions further cause the at least one processor to determine a plurality of respective differences between the first electrical characterization and each respective additional electrical characterization;
the select subset of vehicles includes each additional subset of vehicles for which the respective difference between the first electrical characterization and the respective additional electrical characterization is within the characterization threshold; and
the select subset of vehicles does not include each additional subset of vehicles for which the respective difference between the first electrical characterization and the respective additional electrical characterization is not within the characterization threshold, where respective additional subsets of vehicles are not within the characterization threshold if a proportion of vehicles in each respective subset of vehicles which are owned by a single entity exceeds the vehicle ratio threshold.

11. The system of claim 1, wherein the processor-executable instructions which cause the at least one processor to determine a difference between the first electrical characterization and the second electrical characterization cause the at least one processor to determine a distance between the first electrical characterization and the second electrical characterization using a distance function or a similarity metric.

12. The system of claim 1, wherein the processor-executable instructions which cause the at least one processor to determine a difference between the first electrical characterization and the second electrical characterization cause the at least one processor to determine a Wasserstein distance between the first electrical characterization and the second electrical characterization.

13. The system of claim 1, wherein the processor-executable instructions which cause the at least one processor to determine a difference between the first electrical characterization and the second electrical characterization cause the at least one processor to determine the difference between the first electrical characterization and the second electrical characterization using a similarity metric selected from a group of similarity metrics consisting of:
Kolmogrov-Smirnov test; and
chi-squared test.

14. The system of claim 1, wherein:
the characterization threshold further comprises a cranking event ratio threshold; and
the second subset of vehicles is not within the characterization threshold if a proportion of cranking events in data from the second subset of vehicles, for vehicles which are owned by a single entity, exceeds the cranking event ratio threshold.

15. The system of claim 1, wherein:
the characterization threshold further comprises a unique entity threshold; and
the second subset of vehicles is not within the characterization threshold if a total number of unique entities which own vehicles in the second subset of vehicles is below the unique entity threshold.

16. The system of claim 1, wherein:
the characterization threshold further comprises a sample size threshold; and
the second subset of vehicles is not within the characterization threshold if a total number of vehicles in the second subset of vehicles is below the sample size threshold.

17. The system of claim 1, wherein the processor-executable instructions further cause the system to provide an indication of electrical performance of a vehicle by causing the system to:
compare data representing an electrical parameter measured from the vehicle to the electrical system metric;
determine at least one value indicative of electrical performance of the vehicle based on the electrical parameter measured from the vehicle relative to the electrical system metric; and
output the at least one value indicative of electrical performance of the vehicle.

18. A system comprising:
at least one processor; and
at least one non-transitory processor-readable storage medium communicatively coupled to the at least one processor, the at least one non-transitory processor-readable storage medium storing processor-executable instructions which when executed by the at least one processor, cause the at least one processor to:
determine, for a first subset of vehicles, a first electrical characterization;
determine, for a second subset of vehicles different from the first subset of vehicles, a second electrical characterization;
determine a difference between the first electrical characterization and the second electrical characterization;
select a select subset of vehicles, wherein:
the select subset of vehicles includes the first subset of vehicles;
the select subset of vehicles includes the second subset of vehicles if the difference between the first electrical characterization and the second electrical characterization is within a characterization threshold which comprises a cranking event ratio threshold; and
the select subset of vehicles does not include the second subset of vehicles if the difference between the first electrical characterization and the second electrical characterization is not within the characterization threshold, where the second subset of vehicles is not within the characterization threshold if a proportion of cranking events in data from the second subset of vehicles, for vehicles which are owned by a single entity, exceeds the cranking event ratio threshold; and
generate, based on electrical data representing vehicles of the select subset of vehicles, an electrical system metric which is indicative of electrical system performance of vehicles which correspond to vehicles in the select subset of vehicles.

19. A system comprising:
at least one processor; and
at least one non-transitory processor-readable storage medium communicatively coupled to the at least one processor, the at least one non-transitory processor-readable storage medium storing processor-executable instructions which when executed by the at least one processor, cause the at least one processor to:
determine, for a first subset of vehicles, a first electrical characterization;
determine, for a second subset of vehicles different from the first subset of vehicles, a second electrical characterization;
determine a difference between the first electrical characterization and the second electrical characterization;
select a select subset of vehicles, wherein:
the select subset of vehicles includes the first subset of vehicles;
the select subset of vehicles includes the second subset of vehicles if the difference between the first electrical characterization and the second electrical characterization is within a characterization threshold which comprises a unique entity threshold; and
the select subset of vehicles does not include the second subset of vehicles if the difference between the first electrical characterization and the second electrical characterization is not within the characterization threshold, where the second subset of vehicles is not within the characterization threshold if a total number of unique entities which own vehicles in the second subset of vehicles is below the unique entity threshold; and
generate, based on electrical data representing vehicles of the select subset of vehicles, an electrical system metric which is indicative of electrical system performance of vehicles which correspond to vehicles in the select subset of vehicles.

\* \* \* \* \*